US009389509B2

(12) United States Patent
Huang et al.

(10) Patent No.: US 9,389,509 B2
(45) Date of Patent: Jul. 12, 2016

(54) PHOTOSENSITIVE POLYSILOXANE COMPOSITION, PROTECTING FILM AND ELEMENT HAVING THE PROTECTING FILM

(71) Applicant: Chi Mei Corporation, Tainan (TW)

(72) Inventors: Wei-Jie Huang, Taipei (TW); Chun-An Shih, Tainan (TW)

(73) Assignee: Chi Mei Corporation, Tainan (TW)

( * ) Notice: Subject to any disclaimer, the term of this patent is extended or adjusted under 35 U.S.C. 154(b) by 0 days.

(21) Appl. No.: 14/620,195

(22) Filed: Feb. 12, 2015

(65) Prior Publication Data

US 2015/0234275 A1    Aug. 20, 2015

(30) Foreign Application Priority Data

Feb. 18, 2014 (TW) ............... 103105298 A

(51) Int. Cl.
| | | |
|---|---|---|
| *G03F 7/075* | (2006.01) | |
| *C08L 83/04* | (2006.01) | |
| *C08L 83/10* | (2006.01) | |
| *C09D 183/04* | (2006.01) | |
| *C09D 183/06* | (2006.01) | |
| *C08G 77/06* | (2006.01) | |

(Continued)

(52) U.S. Cl.
CPC ............. *G03F 7/0757* (2013.01); *C08G 77/06* (2013.01); *C08G 77/18* (2013.01); *C08L 83/04* (2013.01); *C08L 83/10* (2013.01); *C09D 183/04* (2013.01); *C09D 183/06* (2013.01); *G03F 7/0226* (2013.01); *G03F 7/0233* (2013.01); *G03F 7/038* (2013.01)

(58) Field of Classification Search
CPC ....... G03F 7/075; G03F 7/757; G03F 7/0755; C08L 83/04; C08L 83/10; C09D 183/04; C09D 183/06; C08G 77/06; C08G 77/18
USPC ............... 430/270.1, 913, 272.1; 524/588
See application file for complete search history.

(56) References Cited

U.S. PATENT DOCUMENTS

| | | | | |
|---|---|---|---|---|
| 4,778,727 A | * | 10/1988 | Tesoro ................... C07F 7/182 428/448 |
| 5,036,145 A | * | 7/1991 | Echterling ......... C08G 73/1007 525/431 |

(Continued)

FOREIGN PATENT DOCUMENTS

| | | |
|---|---|---|
| JP | H03-59667 | 3/1991 |
| JP | H07-098502 | 4/1995 |

(Continued)

OTHER PUBLICATIONS

"Office Action of Taiwan Counterpart Application", issued on Sep. 22, 2015, p. 1-p. 3, in which the listed reference was cited.

*Primary Examiner* — Amanda C Walke
(74) *Attorney, Agent, or Firm* — Jianq Chyun IP Office

(57) ABSTRACT

A photosensitive polysiloxane composition, a protecting film and an element having the protecting film are provided. The photosensitive polysiloxane composition includes a polysiloxane (A), an o-naphthoquinonediazidesulfonate (B), a silane compound (C) containing an amic acid group and a solvent (D). When the photosensitive polysiloxane composition is used for forming a protecting film, the protecting film shows favorable cross-section shape and heat resistance.

10 Claims, 2 Drawing Sheets

(51) Int. Cl.
   *C08G 77/18* (2006.01)
   *G03F 7/022* (2006.01)
   *G03F 7/023* (2006.01)
   *G03F 7/038* (2006.01)

(56) References Cited

U.S. PATENT DOCUMENTS

| | | | |
|---|---|---|---|
| 5,422,177 A * | 6/1995 | Fukuda | G03G 5/0202 428/336 |
| 5,962,113 A * | 10/1999 | Brown | H01L 23/49894 257/E23.077 |
| 6,011,123 A * | 1/2000 | Kurosawa | C08G 77/455 257/E21.259 |
| 6,313,233 B1 * | 11/2001 | Kurosawa | C08G 77/455 257/E21.259 |
| 7,374,856 B2 * | 5/2008 | Suwa | G03F 7/0757 430/169 |
| 8,389,649 B2 * | 3/2013 | Suwa | C08G 77/26 106/287.11 |
| 8,618,236 B2 * | 12/2013 | Liang | C08G 77/455 528/26 |
| 2003/0211407 A1 | 11/2003 | Watanabe et al. | |
| 2010/0129618 A1 * | 5/2010 | Suwa | G03F 7/0233 428/195.1 |
| 2010/0316953 A1 * | 12/2010 | Suwa | C08G 77/26 430/270.1 |
| 2013/0216952 A1 * | 8/2013 | Yokoyama | G03F 7/0757 430/286.1 |

FOREIGN PATENT DOCUMENTS

| | | |
|---|---|---|
| JP | H10-153854 | 6/1998 |
| JP | 2001-281853 | 10/2001 |
| TW | 200836011 | 9/2008 |

* cited by examiner

PHOTOSENSITIVE POLYSILOXANE COMPOSITION, PROTECTING FILM AND ELEMENT HAVING THE PROTECTING FILM

CROSS-REFERENCE TO RELATED APPLICATION

This application claims the priority benefit of Taiwan application serial no. 103105298, filed on Feb. 18, 2014. The entirety of the above-mentioned patent application is hereby incorporated by reference herein and made a part of this specification.

BACKGROUND OF THE INVENTION

1. Field of the Invention

The invention generally relates to a photosensitive polysiloxane composition, a protecting film and an element having such protecting film, and more particularly, to a photosensitive polysiloxane composition used to form a protecting film with favorable cross-section shape and heat resistance, a protecting film with favorable cross-section shape and heat resistance, and an element having such protecting film.

2. Description of Related Art

In recent year, convention technology utilizes a method of increasing aperture ratio for enhancing finesses and resolutions of liquid crystal display (LCD) and organic electroluminescence display (OELD). This method uses a transparent planarization film disposed on top of a thin-film transistor (TFT) as a protecting film, so as to enable data lines and pixel electrodes to overlap with each other, thereby achieving an aperture ratio higher than that of the traditional technology.

In general, a material of the planarization film must have high heat resistance, high transparency and high dielectric constant. Japanese Patent Publication No. 7-98502 discloses a composition containing novolac resin and quinone diazide compound. Japanese Patent Publication No. 10-153854 and Japanese Patent Publication No. 2001-281853 disclose a composition containing acrylic resins and quinone diazide compound. However, heat resistances of these materials are insufficient, and as the cured film is colored due to a high temperature treatment on the substrate, problems in transparency reduction would occur.

On the other hand, the conventional technology utilizes siloxane polymer as the material having high heat resistance, high transparency and high dielectric constant. In order to provide the siloxane polymer with photosensitivity, the quinone diazide compound is combined thereto. For instance, U.S. Patent Application Publication No. 2003-211407 discloses a composition combining siloxane polymer containing a phenolic hydroxyl group at one end with quinone diazide compound; Japanese Patent Publication No. 3-59667 discloses a composition combining siloxane polymer, which contains a phenolic hydroxyl group or a carboxyl group via a cycloaddition reaction, with quinone diazide compound. However, these compositions, due to having large amount of the quinone diazide compound or having the phenolic hydroxyl group in the siloxane polymer, are easily prone to problems such as coated film clouding or coloring during thermal curing. Moreover, it is to be noted that, these conventional compositions all face a problem of having poor cross-section shape, and thus are not conducive to the application.

It is desirable to develop a photosensitive composition capable of forming a protecting film with a favorable cross-section shape.

SUMMARY OF THE INVENTION

Accordingly, the invention is directed to a photosensitive polysiloxane composition used in a protecting film and is capable of improving the poor cross-section shape of the protecting film.

The invention provides a photosensitive polysiloxane composition including a polysiloxane (A), an o-naphthoquinonediazidesulfonate (B), a silane compound (C) containing an amic acid group and a solvent (D). The polysiloxane (A) is formed by polycondensing a compound represented by formula (1),

$$Si(R^1)_w(OR^2)_{4-w} \quad \text{formula (1)},$$

in formula (1), $R^1$ each independently represents a hydrogen atom, an alkyl group of 1-10 carbon atoms, an alkenyl group of 2-10 carbon atoms, an aryl group of 6-15 carbon atoms, an alkyl group containing an anhydride group, an alkyl group containing an epoxy group or an alkoxy group containing an epoxy group; $R^2$ each independently represents a hydrogen atom, an alkyl group of 1-6 carbon atoms, an acyl group of 1-6 carbon atoms or an aryl group of 6-15 carbon atoms; w represents an integer selected from 0, 1, 2 and 3.

The silane compound (C) containing an amic acid group is represented by formula (2),

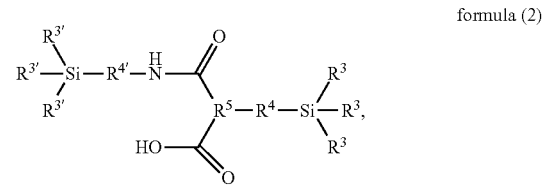

formula (2)

in formula (2), $R^3$ and $R^{3'}$ each independently represents an alkyl group of 1-6 carbon atoms, a substituted alkyl group of 1-6 carbon atoms, an alkoxy group of 1-6 carbon atoms, a substituted alkoxy group of 1-6 carbon atoms, a phenyl group, a substituted phenyl group, a phenoxy group or a substituted phenoxy group; $R^4$ and $R^{4'}$ each independently represents a divalent organic group of 1-10 carbon atoms; $R^5$ represents an organic group of 2-20 carbon atoms.

In an embodiment of the invention, in formula (1), at least one of $R^1$ represents an alkyl group containing anhydride group, an alkyl group containing an epoxy group or an alkoxy group containing an epoxy group.

In an embodiment of the invention, based on an usage amount of 100 parts by weight of the polysiloxane (A), an usage amount of the o-naphthoquinonediazidesulfonate (B) is 1 parts by weight to 30 parts by weight, an usage amount of the silane compound (C) containing an amic acid group is 0.1 parts by weight to 10 parts by weight, and an usage amount of the solvent (D) is 100 parts by weight to 1200 parts by weight.

In an embodiment of the invention, the photosensitive polysiloxane composition further includes a nitrogen-containing heterocyclic compound (E), and the nitrogen-containing heterocyclic compound (E) is selected from the group consisting of compounds represented by formula (3), formula (4), formula (5) and formula (6),

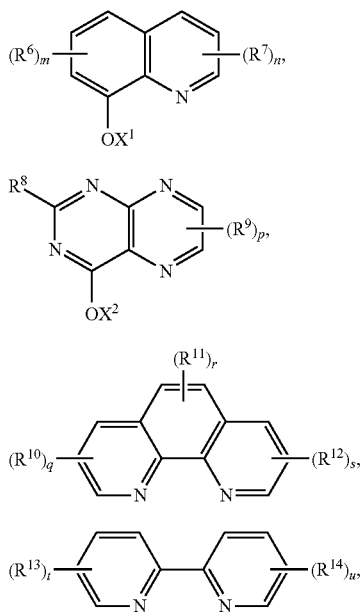

formula (3)

formula (4)

formula (5)

formula (6)

in formula (3), formula (4), formula (5) and formula (6), $X^1$ and $X^2$ each independently represents a hydrogen atom, an acyl group or an alkyl group; $R^6$ to $R^{14}$ each independently represents a hydrogen atom, a hydroxyl group, a carboxylic acid group, a sulfonic acid group, an alkyl group, an amino group, a halogen atom, or a mercapto group; m, n, q and s each independently represents an integer selected from 0, 1, 2 and 3; p and r each independently represents an integer selected from 0, 1 and 2; t and u each independently represents an integer selected from 0, 1, 2, 3 and 4.

In an embodiment of the invention, based on a usage amount of 100 parts by weight of the polysiloxane (A), a usage amount of the nitrogen-containing heterocyclic compound (E) is 0.05 parts by weight to 2 parts by weight.

The invention further provides a protecting film including the above-mentioned photosensitive polysiloxane composition.

The invention also provides an element having a protecting film, which include the element and the above-mentioned protecting film, wherein the protecting film covers on the element.

In view of the above, the photosensitive polysiloxane composition of the invention, due to containing the silane compound containing an amic acid group, when being used to form the protecting film, may enable the protecting film to show favorable cross-section shape and heat resistance.

In order to make the above and other features and advantages of the present invention more comprehensible, embodiments accompanied with figures are described in detail below.

DESCRIPTION OF THE EMBODIMENTS

<Photosensitive Polysiloxane Composition>

Figure 1:
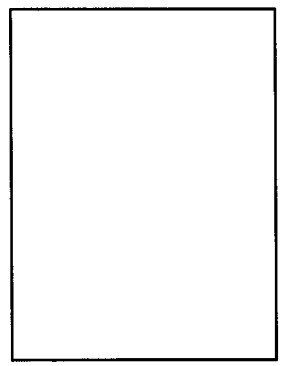
FIG. 1 is a schematic diagram showing a cross-section of vertical shape.

The invention provides a photosensitive polysiloxane composition including a polysiloxane (A), an o-naphthoquinonediazidesulfonate (B), a silane compound (C) containing an amic acid group and a solvent (D). In addition, if necessary, the photosensitive polysiloxane composition may further include a nitrogen-containing heterocyclic compound (E), an additive (F) or a combination of the above.

In the following, the individual compositions used in the photosensitive polysiloxane composition of the invention are described in detail.

It should be mentioned that, in the following, (meth)acrylic acid represents acrylic acid and/or methacrylic acid, and (meth)acrylate represents acrylate and/or methacrylate. Similarly, (meth)acryloyl group represents acryloyl group and/or methacryloyl group.

Polysiloxane (A)

Types of the polysiloxane (A) are not particularly limited as long as the purpose of the invention may be achieved. The polysiloxane (A) may be formed by selecting a silane monomer, a siloxane prepolymer or a combination of silane monomer and siloxane prepolymer to perform polymerization (viz., hydrolysis) and partial condensation.

The polysiloxane (A) is preferably formed by polymerizing a silane monomer represented in formula (1):

formula (1), in formula (1), $R^1$ may each independently represents a hydrogen atom, an alkyl group of 1-10 carbon atoms, an alkenyl group of 2-10 carbon atoms, an aryl group of 6-15 carbon atoms, an alkyl group containing an anhydride group, an alkyl group containing an epoxy group or an alkoxy group containing an epoxy group; $R^2$ may each independently represents a hydrogen atom, an alkyl group of 1-6 carbon atoms, an acyl group of 1-6 carbon atoms or an aryl group of 6-15 carbon atoms; w represents an integer selected from 0, 1, 2 and 3.

In detail, when $R^1$ in formula (1) represents an alkyl group of 1-10 carbon atoms, $R^1$ is, for example, methyl, ethyl, n-propyl, isopropyl, n-butyl, tertiary butyl, n-hexyl or n-decyl. Moreover, $R^1$ may also be an alkyl having other substituents in the alkyl group. Specifically, $R^1$ is, for example, trifluoromethyl, 3,3,3-trifluoropropyl, 3-aminopropyl, 3-mercaptopropyl or 3-isocyanatopropyl.

When $R^1$ in formula (1) represents an alkenyl group of 2-10 carbon atoms, specifically, $R^1$ is, for example, vinyl. Moreover, $R^1$ may also be an alkenyl having other substituents in the alkyl group. Specifically, $R^1$ is, for example, 3-acryloyloxy propyl or 3-methacryloyloxy propyl.

When $R^1$ in formula (1) represents an aryl group of 6-15 carbon atoms specifically, $R^1$ is, for example, phenyl, tolyl or naphthyl. Moreover, $R^1$ may also be an aryl having other substituents in the aryl group. Specifically, $R^1$ is, for example, p-hydroxyphenyl, 1-(p-hydroxyphenyl)ethyl, 2-(p-hydroxyphenyl)ethyl or 4-hydroxy-5-(p-hydroxyphenylcarbonyloxy)penty.

In addition, when $R^1$ in formula (1) represents an alkyl group containing an anhydride group, the alkyl group is preferably an alkyl group of 1-10 carbon atoms. Specifically, the alkyl group containing an anhydride group is, for example, represented by formula (a-1) to formula (a-3) as shown below. It is noted that the anhydride group is formed by intramolecular dehydration of dicarboxylic acid, and the dicarboxylic acid, for example, may be succinic acid or glutaric acid.

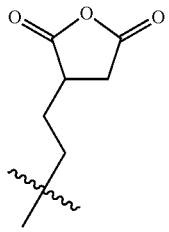

formula (a-1)

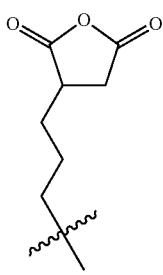

formula (a-2)

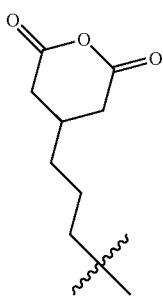

formula (a-3)

Furthermore, when $R^1$ in formula (1) represent an alkyl group containing an epoxy group, the alkyl group is preferably an alkyl group of 1-10 carbon atoms. Specifically, the alkyl group containing an epoxy group is, for example, oxetanylpentyl or 2-(3,4-epoxycyclohexyl)ethyl. It is noted that the epoxy group is a group formed by intramolecular dehydration of diol, and the diol is, for example, propylene glycol, butanediol, or pentanediol.

When $R^1$ in formula (1) represent an alkoxy group containing an epoxy group, the alkoxy group is preferably an alkoxy group of 1-10 carbon atoms. Specifically, the alkoxy group containing an epoxy group is, for example, glycidoxypropyl or 2-oxetanylbutoxy.

It is to be noted that, when at least one of $R^1$ in formula (1) of the polysiloxane (A) is an alkyl group containing anhydride group, an alkyl group containing an epoxy group or an alkoxy group containing an epoxy group, a protecting film formed by a photosensitive polysiloxane composition containing this polysiloxane (A) has a favorable cross-section shape.

Moreover, when $R^2$ in formula (1) represents an alkyl group of 1-6 carbon atoms, specifically, $R^2$ is, for example, methyl, ethyl, n-propyl, isopropyl or n-butyl. When $R^2$ in formula (1) represents an acyl group of 1-6 carbon atoms, specifically, $R^2$ is, for example, acetyl. When $R^2$ in formula (1) represents an aryl group of 6-15 carbon atoms, specifically, $R^2$ is, for example, phenyl.

In formula (1), w is an integer selected from 0 to 3. When w represents 2 or 3, a plurality of $R^1$ may be the same or different; when w represent 1 or 2, a plurality of $R^2$ may be the same or different.

In formula (1), when w=0, it indicates that the silane monomer tetrafunctional silane monomer (i.e., silane monomer having four hydrolyzable groups); when w=1, it indicates that the silane monomer is trifunctional silane monomer (i.e., silane monomer with three hydrolyzable groups); when w=2, it indicates that the silane monomer is bifunctional silane monomer (i.e., silane monomer having two hydrolyzable groups; and when w=3, it indicates that the silane monomer is monofunctional silane monomer (i.e. silane monomer having one hydrolyzable group). It is noted that such hydrolyzable group is defined as the group joined the hydrolysis reaction and bonded with the silicon. For example, a hydrolyzable group may be an alkoxy group, an acyloxy group, or a phenoxy group.

Specific examples of silane monomer include:

(1) tetrafunctional silane monomers: tetramethoxysilane, tetraethoxysilane, tetraacetoxysilane, or tetraphenoxy silane;

(2) trifunctional silane monomers: methyltrimethoxysilane (MTMS), methyltriethoxysilane, methyltriisopropoxysilane, methyltri-n-butoxysilane, ethyltrimethoxysilane, ethyltriethoxysilane, ethyltriisopropoxysilane, ethyltri-n-butoxysilane, n-propyltrimethoxysilane, n-propyltriethoxysilane, n-butyltrimethoxysilane, n-butyltriethoxysilane, n-hexyltrimethoxysilane, n-hexyltriethoxysilane, decyltrimethoxysilane, vinyltrimethoxysilane, vinyltriethoxysilane, 3-acryoyloxypropyltrimethoxysilane, 3-methylacryloyloxypropyltrimethoxysilane (MPTMS), 3-methylacryloyloxypropyltriethoxysilane, phenyltrimethoxysilane (PTMS), phenyltriethoxysilane (PTES), p-hydroxyphenyltrimethoxysilane, 1-(p-hydroxyphenyl)ethyltrimethoxysilane, 2-(p-hydroxyphenyl)ethyltrimethoxysilane, 4-hydroxy-5-(p-hydroxyphenylcarbonyloxy)pentyltrimethoxysilane, trifluoromethyltrimethoxysilane, trifluoromethyltriethoxysilane, 3,3,3-trifluoropropyltrimethoxysilane, 3-aminopropyltrimethoxysilane, 3-aminopropyltriethoxysilane, 3-glycidoxypropyltrimethoxysilane, 3-glycidoxypropyltriethoxysilane, 2-(3,4-epoxycyclohexyl) ethyltrimethoxysilane, 3-mercaptopropyltrimethoxysilane, 2-oxetanylbutoxypropyltriphenoxysilane, the commercially available products from Toagosei Company: 2-oxetanylbutoxypropyltrimethoxysilane (trade name: TMSOX-D), 2-oxetanylbutoxypropyltriethoxysilane (trade name: TESOX-D), 3-triphenoxysilyl propyl succinic anhydride, the commercially available products from Shin-Etsu Chemical Co., Ltd.: 3-trimethoxysilyl propyl succinic anhydride (trade name: X-12-967), the commercially available products from WACKER Company: 3-(triethoxysilyl) propyl succinic anhydride (trade name: GF-20), 3-(trimethoxysilyl) propyl glutaric anhydride (TMSG), 3-(triethoxysilyl) propyl glutaric anhydride, or 3-(triphenoxysilyl) propyl glutaric anhydride;

(3) bifunctional silane monomers: dimethyldimethoxysilane (DMDMS), dimethyldiethoxysilane, dimethyldiacetyloxysilane, di-n-butyldimethoxysilane, diphenyldimethoxysilane, diisopropoxy-di(2-oxetanylbutoxypropyl)silane (DIDOS), di(3-oxetanylpentyl)dimethoxy silane, (di-n-butoxysilyl) di(propyl succinic anhydride), or (dimethoxysilyl) di(ethyl succinic anhydride); or (4) monofunctional silane monomers: trimethylmethoxysilane, tri-n-butylethoxysilane, 3-glycidoxypropyldimethylmethoxysilane, 3-glycidoxypropyldimethylethoxysilane, di(2-oxetanylbutoxypentyl)-2-oxetanylpentylethoxysilane, tri(2-oxetanylpentyl)methoxy silane, phenoxysilyltripropyl succinic anhydride, or methoxysilyldiethyl succinic anhydride. These silane monomers can be used alone or in a combination of two or more.

The polysiloxane (A) preferably includes a siloxane prepolymer represented by the formula (a-4):

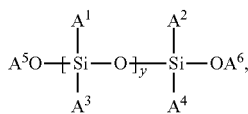

formula (a-4)

in formula (a-4), $A^1$, $A^2$, $A^3$ and $A^4$ each independently represents a hydrogen atom, an alkyl group of 1-10 carbon atoms, an alkenyl group of 2-6 carbon atoms or an aryl group of 6-15 carbon atoms. $A^5$ and $A^6$ each independently represents a hydrogen atom, an alkyl group of 1-6 carbon atoms, an acyl group of 1-6 carbon atoms or an aryl group of 6-15 carbon atoms. And, y represents an integer selected of from 1 to 1000.

In the formula (a-4), $A^1$, $A^2$, $A^3$ and $A^4$ each independently represents an alkyl group of 1-10 carbon atoms, for example, $A^1$, $A^2$, $A^3$ and $A^4$ each independently is methyl, ethyl or n-propyl. In formula (a-4), $A^1$, $A^2$, $A^3$ and $A^4$ each independently represents an alkenyl group of 2-10 carbon atoms, for example, $A^1$, $A^2$, $A^3$ and $A^4$ each independently is vinyl, 3-acryloyloxy propyl or 3-methacryloyloxy propyl. In formula (a-4), $A^1$, $A^2$, $A^3$ and $A^4$ each independently represents an aryl group of 6-15 carbon atoms, for example, $A^1$, $A^2$, $A^3$ and $A^4$ each independently is phenyl, tolyl, naphthyl and so on. It is noted that any one of the above alkyl group, alkenyl group and aryl group may optionally have a substituent.

In formula (a-4), $A^5$ and $A^6$ each independently represents an alkyl group of 1-6 carbon atoms, for example, $A^5$ and $A^6$ each independently is methyl, ethyl, n-propyl, isopropyl or n-butyl. In formula (a-4), $A^5$ and $A^6$ each independently represents an acyl group of 1-6 carbon atoms, such as acetyl. In formula (a-4), $A^5$ and $A^6$ each independently represents an aryl group of 6-15 carbon atoms, such as phenyl. It is noted that any one of the above alkyl group, acyl group and aryl group may have a substituent.

In formula (a-4), y is an integer selected from 1 to 1000, y is preferably an integer selected from 3 to 300, and y is more preferably an integer selected from 5 to 200. When y is an integer selected from 2 to 1000, $A^1$ may be the same or different groups, and $A^3$ may be the same or different groups.

The siloxane prepolymer represented by formula (a-4) may be, for example, 1,1,3,3-tetramethyl-1,3-dimethoxy disiloxane, 1,1,3,3-tetramethyl-1,3-diethoxy disiloxane, 1,1,3,3-tetraethyl-1,3-diethoxy disiloxane or the commercially available products of silanol terminated polysiloxane by Gelest Company (trade names such as DM-S12 (molecular weight of 400 to 700), DMS-S15 (molecular weight of 1500 to 2000), DMS-S21 (molecular weight 4200), DMS-S27 (molecular weight 18000), DMS-S31 (molecular weight 26000), DMS-S32 (molecular weight 36000), DMS-S33 (molecular weight 43500), DMS-S35 (molecular weight 49000), DMS-S38 (MW 58000) DMS-S42 (molecular weight 77000) or PDS-9931 (MW 1000-1400)). The siloxane prepolymer represented by formula (a-4) can be used alone or in a combination of two or more.

It is noted that the silane monomer may be used in combination with the siloxane prepolymer and the mixing ratio thereof is not particularly limited. Preferably, the molar ratios of silicon atoms in the silane monomer and the siloxane prepolymer are from 100:0.01 to 50:50.

In addition, the polysiloxan (A) may be prepared through copolymerization of the silane monomer and/or the siloxane prepolymer, or in combination with silicon dioxide particles.

The average particle diameter of silicon dioxide particles is not particularly limited. The average particle diameter ranges from 2 nm to 250 nm, preferably from 5 nm to 200 nm, and more preferably from 10 nm to 100 nm.

Specific examples of silicon dioxide particles include: commercially available products manufactured by Jgc Catalysts & Chemicals Co., Ltd. (trade names: Oscar 1132 (particle diameter of 12 nm; dispersing agent is methanol), OSCAR 1332 (particle diameter of 12 nm; dispersant n-propanol), OSCAR 105 (particle size 60 nm; dispersant γ-butyrolactone), OSCAR 106 (particle diameter of 120 nm; dispersant diacetone alcohol), etc.); commercially available products by Fuso Chemical Co. (trade names: Quartron PL-1-IPA (particle diameter of 13 nm; dispersant isopropyl ketone), Quartron PL-1-TOL (particle diameter of 13 nm; dispersant toluene), Quartron PL-2L-PGME (18 nm particle size; propylene glycol monomethyl ether), Quartron PL-2L-MEK (particle size 18 nm; dispersant methyl ethyl ketone); or commercially available products manufactured by Nissan Chemical Company (trade names, such as IPA-ST (particle diameter 12 nm; dispersant isopropanol), EG-ST (particle diameter of 12 nm; dispersant ethylene glycol), IPA-ST-L (particle size 45 nm; dispersant isopropanol) or IPA-ST-ZL (particle diameter of 100 nm; dispersant isopropanol). The silicon dioxide particles can be used alone or in a combination of two or more.

The silicon dioxide particles may be used in combination with silane monomer(s) and/or siloxane prepolymer (s) and the mixing ratio is not particularly limited. The molar ratio of silicon atoms in the silicon dioxide particles and siloxane prepolymer is preferably 1% to 50%.

In general, the polymerization reaction (i.e. hydrolysis and condensation) of silane monomer, siloxane prepolymer and/or silicon dioxide particles is based on the following steps: solvents, water and optionally catalyst were added in the mixture of silane monomer, siloxane prepolymer and/or silicon dioxide particles; heated at 50° C. to 150° C. and stirred for 0.5 to 120 hours, and the byproducts (alcohols, water, etc.) were removed by distillation.

The solvent used in the above polymerization reaction is not particularly limited, and the solvent may be the same or different from the solvent (D) included in the photosensitive polysiloxane composition of the present invention. Based on the total amount of silane monomer, siloxane prepolymer and/or silicon dioxide particles being 100 grams, the content of the solvent can be 15 g to 1200 g; preferably 20 g to 1100 g; and more preferably 30 g to 1000 g.

Based on the hydrolyzable groups of the silane monomer, siloxane prepolymer and/or silicon dioxide particles being 1 mole, the amount of water used in the above polymerization reaction (i.e., water used in hydrolysis) is 0.5 moles to 2 moles.

The catalyst used in the above polymerization reaction is not particularly limited, and is preferably selected from the group consisting of an acidic catalyst and a basic catalyst. Specific examples of the acidic catalyst include: hydrochloric acid, nitric acid, sulfuric acid, hydrofluoric acid, oxalic acid, phosphoric acid, acetic acid, trifluoroacetic acid, formic acid, polybasic carboxylic acid or an anhydride thereof, or ion exchange resins. Specific examples of the basic catalyst include: diethylamine, triethylamine, tripropylamine, tributylamine, tripentylamine, trihexylamine, triheptylamine, trioctylamine, diethanolamine, triethanolamine, sodium hydroxide, potassium hydroxide, the amino group-containing silane having an alkoxy group or ion exchange resins and the like.

Based on the total amount of the silane monomer, siloxane prepolymer and/or silica particles being 100 grams, the content of the catalyst used in the above polymerization reaction preferably ranges from 0.005 g to 15 g; more preferably 0.01 g to 12 g; and most preferably from 0.05 g to 10 g.

In views of stability, the polysiloxane (A) preferably excludes byproducts (such as alcohols or water) and the catalyst. Accordingly, the reaction mixture may be optionally purified after the polymerization reaction to obtain the purified polysiloxane (A). The purification method is not particularly limited. A hydrophobic solvent is preferably used for the dilution of the reaction mixture. Subsequently, the hydrophobic solvent and the reaction mixture were transferred to a separation funnel, and the organic layer is then washed with water several times and concentrated by rotary evaporator to remove the alcohol or water. In addition, ion exchange resins may be used to remove the catalyst.

O-naphthoquinonediazidesulfonate (B)

The types of o-naphthoquinonediazidesulfonate (B) are not particularly limited, and the commonly used o-naphthoquinonediazidesulfonate may be used. Such o-naphthoquinonediazidesulfonate (B) may be completely esterified or partially esterified ester-based compound(s).

O-naphthoquinonediazidesulfonate (B) is preferred prepared by reacting hydroxy compound with o-naphthoquinonediazidesulfonic acid or salts thereof. O-naphthoquinonediazidesulfonate (B) is more preferably prepared by the reaction of o-naphthoquinonediazidesulfonic acid or salts thereof with the polyhydroxy compound.

Specific examples of o-naphthoquinonediazidesulfonate include o-naphthoquinone diazide-4-sulfonic acid, o-naphthoquinone diazide-5-sulfonic acid or o-naphthoquinone diazide-6-sulfonic acid. In addition, the o-naphthoquinonediazidesulfonic acid salts may, for example, be o-naphthoquinone diazonaphthoquinone sulfonyl halides.

Specific examples of the hydroxy compound include:

(1) hydroxybenzophenone-based compounds, such as, 2,3,4-trihydroxybenzophenone, 2,4,4'-trihydroxybenzophenone, 2,4,6-trihydroxybenzophenone, 2,3,4,4 tetrahydroxy benzophenone, 2,4,2',4'-tetrahydroxy benzophenone, 2,4,6,3',4'-pentahydroxy-benzophenone, 2,3,4,2',4'-pentahydroxy-benzophenone, 2,3,4,2',5'-pentahydroxy-benzophenone, 2,4,5,3',5'-pentahydroxy-benzophenone or 2,3,4,3',4',5'-hexahydroxy-benzophenone.

(2) hydroxyaryl-based compounds, such as, hydroxy aryl compound represented by the formula (b-1):

formula (b-1)

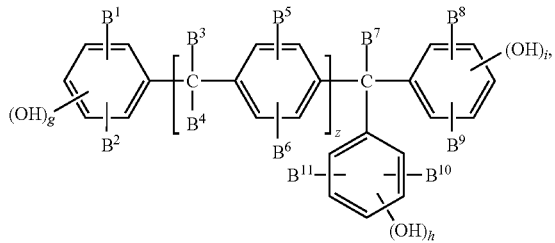

in formula (b-1), $B^1$ and $B^2$ each independently represents a hydrogen atom, a halogen atom or an alkyl group of 1-6 carbon atoms; $B^3$, $B^4$ and $B^7$ each independently represents a hydrogen atom or an alkyl group of 1-6 carbon atoms; $B^5$, $B^6$, $B^8$, $B^9$, $B^{10}$ and $B^{11}$ each independently represents a hydrogen atom, a halogen atom, an alkyl group of 1-6 carbon atoms, an alkoxy group of 1-6 carbon atoms, an alkenyl group of 1-6 carbon atoms or a cycloalkyl group; g, h and i each independently represents an integer selected from 1 to 3; z represents 0 or 1.

Specifically, the specific examples of the hydroxyaryl-based compound represented by formula (b-1) include: tris (4-hydroxyphenyl) methane, bis(4-hydroxy-3,5-dimethylphenyl)-4-hydroxyphenyl methane, bis(4-hydroxy-3,5-dimethylphenyl)-3-hydroxyphenyl methane, bis(4-hydroxy-3,5-dimethylphenyl)-2-hydroxyphenyl methane, bis(4-hydroxy-2,5-dimethylphenyl)-4-hydroxyphenyl methane, bis(4-hydroxy-2,5-dimethylphenyl)-3-hydroxyphenyl methane, bis(4-hydroxy-2,5-dimethylphenyl)-2-hydroxyphenyl methane, bis(4-hydroxy-3,5-dimethylphenyl)-3,4-bis(hydroxyphenyl) methane bis(4-hydroxy-2,5-dimethylphenyl)-3,4-dihydroxyphenyl methane, bis(4-hydroxy-3,5-dimethylphenyl)-2,4-hydroxyphenyl methane, bis(4-hydroxy-2,5-dimethylphenyl)-2,4-dihydroxyphenyl methane, bis(4-hydroxyphenyl)-3-methoxy-4-hydroxyphenyl methane, bis (3-cyclohexyl-4-hydroxyphenyl)-3-hydroxyphenyl methane, bis(3-cyclohexyl-4-hydroxyphenyl)-2-hydroxyphenyl methane, bis(3-cyclohexyl-4-hydroxyphenyl)-4-hydroxyphenyl methane, bis(3-cyclohexyl-4-hydroxy-6-methylphenyl)-2-hydroxyphenyl methane, bis(3-cyclohexyl-4-hydroxy-6-methylphenyl)-3-hydroxyphenyl methane, bis(3-cyclohexyl-4-hydroxy-6-methylphenyl)-4-hydroxyphenyl methane, bis(3-cyclohexyl-4-hydroxy-6-methylphenyl)-3,4-dihydroxyphenyl methane, bis(3-cyclohexyl-6-hydroxyphenyl)-3-hydroxyphenyl methane, bis(3-cyclohexyl-6-hydroxyphenyl)-4-hydroxyphenyl methane, bis(3-cyclohexyl-6-hydroxyphenyl)-2-hydroxyphenyl methane, bis(3-cyclohexyl-6-hydroxy-4-methylphenyl)-2-hydroxyphenyl methane, bis(3-cyclohexyl-6-hydroxy-4-methylphenyl)-4-hydroxyphenyl methane, bis(3-cyclohexyl-6-hydroxy-4-methylphenyl)-3,4-dihydroxyphenyl methane, 1-[1-(4-hydroxyphenyl)isopropyl]-4-[1,1-bis(4-hydroxyphenyl)ethyl] benzene or 1-[1-(3-methyl-4-hydroxyphenyl)isopropyl]-4-[1,1-bis(3-methyl-4-hydroxyphenyl)ethyl]benzene.

(3) (hydroxyphenyl) hydrocarbon compounds may, for example, be (hydroxyphenyl) hydrocarbon compounds represented by the formula (b-2) as shown:

formula (b-2)

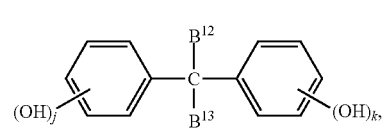

in formula (b-2), $B^{12}$ and $B^{13}$ each independently represents a hydrogen atom or an alkyl group of 1-6 carbon atoms; j and k each independently represents an integer selected from 1 to 3.

Specifically, specific examples of the (hydroxyphenyl) hydrocarbon compounds represented by the formula (b-2) include: 2-(2,3,4-trihydroxyphenyl)-2-(2',3',4'-trihydroxyphenyl) propane, 2-(2,4-dihydroxyphenyl)-2-(2',4'-dihydroxyphenyl) propane, 2-(4-hydroxyphenyl)-2-(4'-hydroxyphenyl) propane, bis(2,3,4-trihydroxyphenyl) methane or bis(2,4-dihydroxyphenyl) methane.

(4) Specific examples of other aromatic hydroxyl compounds include: phenol, p-methoxyphenol, dimethylphenol, hydroquinone, bisphenol A, naphthol, catechol, 1,2,3-pyrogallol methyl ether, 1,2,3-pyrogallol-1,3-dimethyl ether, 3,4, 5-trihydroxy benzoic acid, or partially esterified or etherified 3,4,5-trihydroxy benzoic acid.

The hydroxy compound is preferably 1-[1-(4-hydroxyphenyl) isopropyl]-4-[1,1-bis(4-hydroxyphenyl)ethyl]benzene, 2,3,4-trihydroxybenzophenone, 2,3,4,4'-tetrahydroxybenzophenone, or a combination thereof. The hydroxy compounds can be used alone or in a combination of two or more.

The reaction of o-naphthoquinone diazide sulfonic acid or the salts thereof with the hydroxy compound(s) is usually performed in organic solvents, such as dioxane, N-pyrrolidone, acetamides and etc. Further, the reaction is preferably performed in alkaline condensing agents, such as triethanolamine, alkali metal carbonates or alkali metal bicarbonates.

The degree of esterification of o-naphthoquinonediazidesulfonate (B) is preferably more than 50%. That is, to the total amount of the hydroxyl groups in the hydroxy compound as 100 mol %, 50 mole % or more hydroxyl groups in the hydroxy compound react with o-naphthoquinonediazidesulfonic acid or salts thereof in the esterification reaction. The degree of esterification of o-naphthoquinonediazidesulfonate (B) is more preferably 60% or more.

Based on the usage amount of 100 parts by weight of polysiloxane (A), a usage amount of the o-naphthoquinonediazidesulfonate (B) can be 1 parts by weight to 30 parts by weight; preferably 3 parts by weight to 28 parts by weight; and more preferably 5 parts by weight to 25 parts by weight.

Silane Compound (C) Containing an Amic Acid Group

Silane compound (C) containing an amic acid group is represented by formula (2),

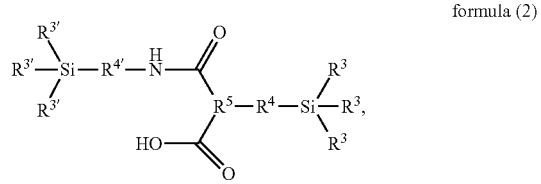

formula (2)

in formula (2), $R^3$ and $R^{3\prime}$ each independently represents an alkyl group of 1-6 carbon atoms, a substituted alkyl group of 1-6 carbon atoms, an alkoxy group of 1-6 carbon atoms, a substituted alkoxy group of 1-6 carbon atoms, a phenyl group, a substituted phenyl group, a phenoxy group or a substituted phenoxy group; $R^4$ and $R^{4\prime}$ each independently represents a divalent organic group of 1-10 carbon atoms; $R^5$ represents an organic group of 2-20 carbon atoms.

The silane compound (C) containing an amic acid group is, for example, obtained by reacting the silane compound containing an amino group represented by formula (c-1) with the silane compound containing an anhydride group represent by formula (c-2).

formula (c-1)

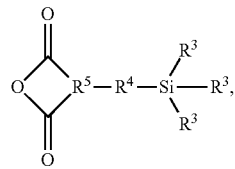

formula (c-2)

in formula (c-1) and formula (c-2), $R^3$, $R^{3\prime}$, $R^4$, $R^{4\prime}$ and $R^5$ are respectively the same as $R^3$, $R^{3\prime}$, $R^4$, $R^{4\prime}$ and $R^5$ in formula (2), and thus are not to be repeated herein.

When $R^3$ and $R^{3\prime}$ in formula (1), formula (c-1) and formula (c-2) represent alkyl groups, $R^3$ and $R^{3\prime}$ are preferably alkyl groups of 1-6 carbon atoms. Specifically, $R^3$ and $R^{3\prime}$ are, for example, methyl, ethyl, n-propyl, isopropyl, butyl, pentyl or hexyl. In terms of easy preparation, $R^3$ and $R^{3\prime}$ are preferably methyl or ethyl. When $R^3$ and $R^{3\prime}$ in formula (1), formula (c-1) and formula (c-2) represent alkoxy groups, $R^3$ and $R^{3\prime}$ are preferably alkoxy groups of 1-6 carbon atoms. Specifically, $R^3$ and $R^{3\prime}$ are, for example, methoxy, ethoxy, n-propoxy, isopropoxy, butoxy, pentoxy or hexyloxy. In terms of easy preparation, $R^3$ and $R^{3\prime}$ are preferably methoxy or ethoxy. Moreover, the alkyl group of 1-6 carbon atoms, the alkoxy group of 1-6 carbon atoms, the phenyl group or the phenoxy group may be an organic group with hydrogen being substituted by an alkyl group, an alkoxy group, a phenyl group or a phenoxy group. Specifically, the organic group is, for example, 1-methoxypropyl.

When $R^4$ and $R^{4\prime}$ in formula (1), formula (c-1) and formula (c-2) represent divalent organic groups of 1-10 carbon atoms, $R^4$ and $R^{4\prime}$ are, for example, methylene, ethylene, n-propylene, n-butylene, n-pentylene, oxymethylene (—OCH$_2$—), oxyethylene (—OCH$_2$CH$_2$—), oxy-n-propylene (—OCH$_2$CH$_2$CH$_2$—), oxy-n-butylene (—OCH$_2$CH$_2$CH$_2$CH$_2$—), oxy-n-pentylene (—OCH$_2$CH$_2$CH$_2$CH$_2$CH$_2$—), phenylene, aralkylene group (a divalent linking group obtained by combining an alkylene with an arylene) or nitrogen-substituted alkylene (an alkylene in the alkylene group with —CH$_2$-being substituted by —NH—). In terms of easy preparation, $R^4$ and $R^{4\prime}$ are preferably methylene, ethylene, n-propylene, or n-butylene.

Specific examples of the silane compound containing an amino group represented by formula (c-1) include 4-aminobutyltriethoxysilane, 4-amino-3,3-dimethylbutyltrimethoxysilane, 1-amino-2-(dimethylethoxysilyl)propane, N-(2-aminoethyl)-3-aminoisobutyldimethylmethoxysilane, N-(2-aminoethyl)-3-aminoisobutylmethyldimethoxysilane, (aminoethylaminomethyl)phenethyltrimethoxysilane, N-(2-aminoethyl)-3-aminopropylmethyldimethoxysilane, N-(2-aminoethyl)-3-aminopropyltrimethoxysilane, N-(2-aminoethyl)-3-aminopropyltriethoxysilane, N-(2-aminoethyl)-3-aminopropylsilanetriol, N-(6-aminohexyl) aminomethyltriethoxysilane, N-(6-aminohexyl) aminomethyltrimethoxysilane, N-(2-aminoethyl)-11-aminoundecyltrimethoxysilane, aminomethyltrimethylsilane, 3-(m-aminophenoxy)propyltrimethoxysilane, m-aminophenyltrimethoxysilane, p-aminophenyltrimethoxysilane, aminophenyltrimethoxysilane, N-3-[(amino (polypropylenoxy))aminopropyltrimethoxysilane, 3-aminopropyldiisopropylethoxysilane, 3-aminopropyldimethylethoxysilane, 3-aminopropylmethyldiethoxysilane, 3-aminopropyltriethoxysilane, 3-aminopropyltriethoysilane, 3-aminopropyltrimethoxysilane, 3-aminopropyltrimethylsilane or 11-aminoundecyltriethoxysilane. The silane compounds containing an amino group represented by formula (c-1) can be used alone or in a combination of two or more.

In the silane compound containing an anhydride group represented by formula (c-2), $R^5$ represents an organic group containing aromatic ring or aliphatic ring or a 3-to-14-valent organic group having carbon atoms of 4 to 20. Specifically, specific examples of the anhydride group structure represented by formula (c-2) include maleic anhydride, phthalic anhydride, methylphthalic anhydride, succinic anhydride, glutaric anhydride, 4-methyl cyclohexane-1,2-dicarboxylic anhydride, cis-4-cyclohexane-1,2-dicarboxylic anhydride, cis-1,2-cyclohexane dicarboxylic anhydride, 1,8-naphthalic anhydride, methyl-5-norbornene-2,3-dicarboxylic anhydride, 5-norbornene-2,3-dicarboxylic anhydride (the above compounds are manufactured by Tokyo Chemical Industry Co., Ltd.), 3,4,5,6-tetrahydrphthalic anhydride (manufactured by Wako Pure Chemical Industries, Ltd.), RIKACID HNA (trade name, manufactured by New Japan Chemical Co., Ltd.), RIKACID HNA-100 (trade name, manufactured by New Japan Chemical Co., Ltd.); the anhydride group structure represented by formula (c-2) is preferably phthalic anhydride, succinic anhydride, glutaric anhydride, 4-methyl cyclohexane-1,2-dicarboxylic anhydride, 1,8-naphthalic anhydride, 5-norbornene-2,3-dicarboxylic anhydride or methylphthalic anhydride. In views of transparency and adhesion, the anhydride group structure represented by formula (c-2) is preferably succinic anhydride, glutaric anhydride or 5-norbornene-2,3-dicarboxylic anhydride.

Specific examples of the silane compound containing an anhydride group represented by formula (c-2) include 3-(triphenoxysilyl)propylsuccinic anhydride, 3-(trimethoxysilyl)propylsuccinic anhydride, 3-(triethoxysilyl)propylsuccinic anhydride (trade name: GF-20), 3-(trimethoxysilyl)propylglutaric anhydride, 3-(triethoxysilyl)propylglutaric anhydride, 3-(triphenoxysilyl)propylglutaric anhydride, (di-n-butoxysilyl) di(propyl succinic anhydride), (dimethoxysilyl)di(ethyl succinic anhydride), (phenoxysilyl)tri(propylsuccinic anhydride), (methylmethoxysilyl)diethylsuccinic anhydride) or 2-trimethoxysilyl ethylphthalic anhydride.

Specific examples of the silane compound containing an anhydride group represented by formula (c-2) can be used alone or in a combination of two or more.

Reaction temperatures of the silane compound containing an amino group represented by formula (c-1) and the silane compound containing an anhydride group represented by formula (c-2) may be from room temperature to 60° C., wherein if the reaction temperatures exceed 60° C., then an imide group may be produced, thereby causing the pattern to have a poor cross-section shape. In addition, the reaction time may be from 0.5 to 6 hours. The reactions are preferably to be performed with the presence of solvent, and such solvent may be the same as a solvent (D) described in below, and thus no further elaboration is provided herein.

It is to be noted that, when the photosensitive polysiloxane composition does not include the silane compound (C) containing an amic acid group, a cross-section shape of the protecting film formed by the photosensitive polysiloxane composition is poor.

Based on the usage amount of 100 parts by weight of the polysiloxane (A), the usage amount of the silane compound (C) containing an amic acid group may be 0.1 parts by weight to 10 parts by weight, preferably 0.2 parts by weight to 9 parts by weight, and more preferably 0.3 parts by weight to 8 parts by weight.

Solvent (D)

The type of the solvent (D) is not particularly limited. The solvent (D), for example, is a compound containing an alcoholic hydroxy group or a cyclic compound containing a carbonyl group.

The compound containing an alcoholic hydroxy group may be, for example, acetol, 3-hydroxy-3-methyl-2-butanone, 4-hydroxy-3-methyl-2-butanone, 5-hydroxy-2-pentanone, 4-hydroxy-4-methyl-2-pentanone (also known as diacetone alcohol, DAA), ethyl lactate, butyl lactate, propylene glycol monomethyl ether, propylene glycol monoethyl ether (PGEE), propylene glycol monomethyl ether acetate (PGMEA), propylene glycol mono-n-propyl ether, propylene glycol mono-n-butyl ether, propylene glycol mono-t-butyl ether, 3-methoxy-1-butanol, 3-methyl-3-methoxy-1-butanol, or a combination thereof. It is noted that the compound containing an alcoholic hydroxy group is preferred diacetone alcohol, ethyl lactate, propylene glycol monoethyl ether, propylene glycol monomethyl ether acetate or combinations thereof. The compound containing an alcoholic hydroxy group can be used alone or in a combination of two or more.

Specific examples of the cyclic compound containing a carbonyl group include: γ-butyrolactone, γ-valerolactone, δ-valerolactone, propylene carbonate, N-methyl pyrrolidone, cyclohexanone or cycloheptanone. It is noted that the cyclic compound containing a carbonyl group is preferably γ-butyrolactone, N-methyl pyrrolidone, cyclohexanone or the combinations thereof. The cyclic compound containing a carbonyl group can be used alone or in a combination of two or more.

The compound containing an alcoholic hydroxy group may be used in combination with the cyclic compound containing a carbonyl group, and the mixing weight ratio of both is not particularly limited. The weight ratio of the compound containing an alcoholic hydroxy group and the cyclic compound containing a carbonyl group ranges preferably from 99/1 to 50/50; more preferably from 95/5 to 60/40. It is noted that the unreacted silanol (Si—OH) groups in polysiloxane (A), when the weight ratio of the compound containing an alcoholic hydroxy group and the cyclic compound containing a carbonyl group is from 99/1 to 50/50 in the solvent (D), are unlikely to produce a condensation reaction and the storage stability is lowered. In addition, since the compound containing an alcoholic hydroxy group and the cyclic compound containing a carbonyl group have good compatibility with o-naphthoquinonediazidesulfonate (B), it is unlikely that the blushing phenomenon occurs in the coating film and the transparency of the protecting film can be maintained.

Without lowering the effect of the present invention, other solvents may be included. Specific examples of these other solvents include: (1) esters: ethyl acetate, n-propyl acetate, iso-propyl acetate, n-butyl acetate, isobutyl acetate, propylene glycol monomethyl ether acetate, 3-methoxy-1-butyl acetate or 3-methyl-3-methoxy-1-butyl acetate, etc.; (2) ketones: methyl isobutyl ketone, diisopropyl ketone, or diisobutyl ketone, etc.; or (3) ethers: diethyl ether, diisopropyl ether, di-n-butyl ether or diphenyl ether.

Based on the usage amount of 100 parts by weight of the polysiloxane (A), the usage amount of the solvent (D) can be 100 parts by weight to 1200 parts by weight; preferably 200 parts by weight to 1100 parts by weight; and more preferably 300 parts by weight to 1000 parts by weight.

Nitrogen-Containing Heterocyclic Compound (E)

Nitrogen-containing heterocyclic compound (E) is selected from the group consisting of compounds represented by formula (3), formula (4), formula (5) and formula (6).

Specifically, compounds represented by formula (3), formula (4), formula (5) and formula (6) are as follows:

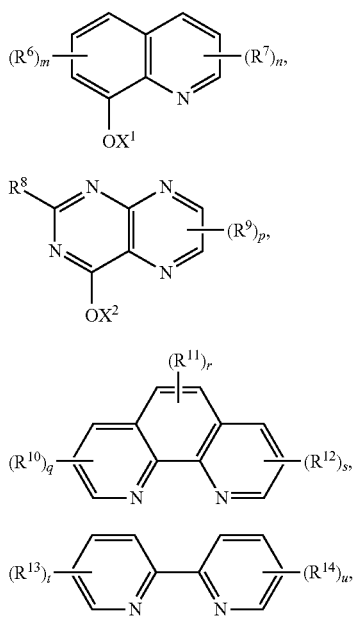

in formula (3), formula (4), formula (5) and formula (6), $X^1$ and $X^2$ each independently represents a hydrogen atom, an acyl group or an alkyl group; $R^6$ to $R^{14}$ each independently represents a hydrogen atom, a hydroxyl group, a carboxylic acid group, a sulfonic acid group, an alkyl group, an amino group, a halogen atom, or a mercapto group; m, n, q and s each independently represents an integer selected from 0, 1, 2 and 3; p and r each independently represents an integer selected from 0, 1 and 2; t and u each independently represents an integer selected from 0, 1, 2, 3 and 4.

In formula (3), formula (4), formula (5) and formula (6), $X^1$ and $X^2$ each independently represents a hydrogen atom, an acyl group, or an alkyl group. Specifically, $X^1$ and $X^2$ is preferably an acyl group of 2-4 carbon atoms (such as acetyl group, propionyl group, or butyryl group) or an alkyl group of 1-3 carbon atoms (such as methyl, ethyl, i-propyl group, or n-propyl group).

In formula (3), formula (4), formula (5) and formula (6), $R^6$ to $R^{14}$ independently represents a hydrogen atom, a hydroxyl group, a carboxylic acid group, a sulfonic acid group, an alkyl group, an amino group, a halogen atom, or a mercapto group. Specifically, when $R^6$ to $R^{14}$ is an alkyl group, $R^6$ to $R^{14}$ is preferably an alkyl group of 1-3 carbon atoms (such as methyl, ethyl, i-propyl group, or n-propyl group). When $R^6$ to $R^{14}$ is a halogen atom, $R^6$ to $R^{14}$ is preferably a chlorine atom, a bromine atom or an iodine atom. When $R^6$ to $R^{14}$ is an amino group, the hydrogen in the amino group may be replaced by 1 or 2 alkyl groups of 1-3 carbon atoms (such as methyl, ethyl, i-propyl group, or n-propyl group). In addition, $R^6$ to $R^{14}$ may also be an alkyl group of 1-3 carbon atoms and containing an amino group (such as aminomethyl, aminoethyl, amino-i-propyl, or amino-n-propyl amine).

It is to be noted that, in formula (3), formula (4), formula (5) and formula (6), when m, n, p, q, r and s are greater than or equal to 2, $R^6$, $R^7$, $R^9$, $R^{10}$, $R^{11}$ and $R^{12}$ may be the same or different groups.

Specific examples of nitrogen-containing heterocyclic compound (E) include: 6-methyl-8-hydroxyquinoline, 6-ethyl-8-hydroxyquinoline, 5-methyl-8-hydroxyquinoline, 8-hydroxyquinoline; 8-acetyloxy quinoline, 4-hydroxypteridine, 2,4-dihydroxypteridine, 4-hydroxypteridine-2-sulfonic acid, 2-ethyl-4-hydroxypteridine, 2-methyl-4-hydroxypteridine, 2-amino-6,7-dimethyl-4-hydroxypteridine, 1,10-phenanthroline, 5,6-dimethyl-1,10-phenanthroline, 3,8-dimethyl-1,10-phenanthroline, 3,8-dihydroxy-1,10-phenanthroline, 5-carboxy-1,10-phenanthroline, 5,6-dihydroxy-1,10-phenanthroline, 1,10-phenanthroline-5-sulfonic acid, 4,4'-dimethyl-2,2'-bipyridyl, 2,2'-bipyridyl, 2,2'-bipyridyl-5-carboxylic acid, 5,5'-dichloro-2,2'-bipyridyl, 3,3'-dihydroxy-2,2'-bipyridyl, 3,3'-dimercapto-2,2'-bipyridyl, or a combination thereof.

Nitrogen-containing heterocyclic compound (E) is preferably 8-hydroxyquinoline, 1,10-phenanthroline, 4-hydroxypteridin, or a combination thereof.

It is to be noted that, when the photosensitive polysiloxane composition contains nitrogen-containing heterocyclic compound (E), heat resistance of the photosensitive polysiloxane composition is favorable.

In view of the heat resistance, based on the usage amount of 100 parts by weight of the polysiloxane (A), the usage amount of the nitrogen-containing heterocyclic compound (E) can be 0.05 parts by weight to 2 parts by weight, preferably 0.1 parts by weight to 2 parts by weight, and more preferably 0.1 parts by weight to 1.8 parts by weight.

Additive (F)

The photosensitive polysiloxane composition of the invention may optionally further include additives (F). Specifically, the additives (F) may be, for example, sensitizer, adhesion auxiliary agent, surfactants, solubility promoters, defoamers, or combinations thereof.

The type of the sensitizer is not particularly limited. The sensitizer may use preferably a compound containing a phenolic hydroxyl group, for example:

(1) trisphenol type compound: such as tris(4-hydroxyphenyl) methane, bis(4-hydroxy-3-methylphenyl)-2-hydroxyphenyl methane, bis(4-hydroxy-2,3,5-trimethylphenyl)-2-hydroxyphenyl methane, bis(4-hydroxy-3,5-dimethylphenyl)-4-hydroxyphenyl methane, bis(4-hydroxy-3,5-dimethylphenyl)-3-hydroxyphenyl methane, bis(4-hydroxy-3,5-methylphenyl)-2-hydroxyphenyl methane, bis (4-hydroxy-2,5-dimethylphenyl)-4-hydroxyphenyl methane, bis(4-hydroxy-2,5-dimethylphenyl)-3-hydroxyphenyl methane, bis(4-hydroxy-2,5-dimethylphenyl)-2-hydroxyphenyl methane, bis(4-hydroxy-3,5-dimethylphenyl)-3,4-dihydroxyphenyl methane, bis(4-hydroxy-2,5-dimethylphenyl)-3,4-dihydroxyphenyl methane, bis(4-hydroxy-2,5-dimethylphenyl)-2,4-bis(hydroxyphenyl) methane, bis(4-hydroxyphenyl)-3-methoxy-4-hydroxyphenyl methane, bis(5-cyclohexyl-4-hydroxy-2-methylphenyl)-4-hydroxyphenyl methane, bis(5-cyclohexyl-4-hydroxy-2-methylphenyl)-3-hydroxyphenyl methane, bis(5-cyclohexyl-4-hydroxy-2-methylphenyl)-2-hydroxyphenyl methane or bis(5-cyclohexyl-4-hydroxy-2-methylphenyl)-3,4-dihydroxyphenyl methane, etc.;

(2) bisphenol type compound: such as bis(2,3,4-trihydroxyphenyl) methane, bis(2,4-dihydroxyphenyl) methane, 2,3,4-trihydroxyphenyl-4'-hydroxyphenyl methane, 2-(2,3,4-trihydroxyphenyl)-2-(2',3',4'-trihydroxyphenyl) propane, 2-(2,4-dihydroxyphenyl)-2-(2',4'-dihydroxyphenyl) propane, 2-(4-hydroxyphenyl)-2-(4'-hydroxyphenyl) propane, 2-(3-fluoro-4-hydroxyphenyl)-2-(3'-fluoro-4'-hydroxyphenyl) propane, 2-(2,4-dihydroxyphenyl)-2-(4'-hydroxyphenyl) propane, 2-(2,3,4-trihydroxyphenyl)-2-(4'-hydroxyphenyl) propane or 2-(2,3,4-trihydroxyphenyl)-2-(4'-hydroxy-3',5'-dimethylphenyl) propane, etc.;

(3) polynuclear branched compounds: such as 1-[1-(4-hydroxyphenyl)isopropyl]-4-[1,1-bis(4-hydroxyphenyl)-ethyl] phenyl or 1-[1-(3-methyl-4-hydroxyphenyl)isopropyl]-4-[1, 1-bis(3-methyl-4-hydroxyphenyl) ethyl]benzene, etc.;

(4) condensation type phenol compound: such as 1,1-bis (4-hydroxyphenyl) cyclohexane, etc.;

(5) polyhydroxy benzophenones: such as 2,3,4-trihydroxy benzophenone, 2,4,4'-trihydroxy benzophenone, 2,4,6-trihydroxy benzophenone, 2,3,4-trihydroxy-2'-methyl-benzophenone, 2,3,4,4'-tetrahydroxy benzophenone, 2,4,2',4'-tetrahydroxy benzophenone, 2,4,6,3',4'-pentahydroxy benzophenone, 2,3,4,2',4'-pentahydroxy benzophenone, 2,3, 4,2',5'-pentahydroxy benzophenone, 2,4,6,3',4',5'-hexahydroxy benzophenone or 2,3,4,3',4',5'-hexahydroxy benzophenone, etc.; or (6) the combinations of the above-mentioned compounds containing a phenolic hydroxyl group.

Based on the usage amount of 100 parts by weight of the polysiloxane (A), the content of the sensitizer is 5 parts by weight to 50 parts by weight; preferably 8 parts by weight to 40 parts by weight; and more preferably 10 parts by weight to 35 by weight.

Adhesion auxiliary agents may be, for example, melamine compounds, silane-based compounds or the like. The role of the adhesion auxiliary agent is to increase the adhesion between the protecting film or the element to be protected and the protecting film that is formed by the photosensitive polysiloxane composition.

Commercially available products of the melamine compounds are, for example, manufactured by Mitsui Chemicals, trade names Cymel-300, Cymel-303, etc.; or the products manufactured by Sanwa Chemical, trade names MW-30MH, MW-30, MS-11, MS-001, MX-750 or MX-706.

When using the melamine compound as the adhesion auxiliary agent, based on the usage amount of 100 parts by weight of the polysiloxane (A), the content of the melamine compound is from 0 parts by weight to 20 parts by weight; preferably from 0.5 parts by weight to 18 parts by weight; and more preferably 1.0 parts by weight to 15 parts by weight.

Specific examples of the silane-based compounds include: vinyl trimethoxy silane, vinyl triethoxy silane, 3-acryloyloxypropyltrimethoxy silane, vinyl tris(2-methoxyethoxy) silane, N-(2-aminoethyl)-3-aminopropylmethyl dimethoxy silane, N-(2-aminoethyl)-3-aminopropyl trimethoxy silane, 3-aminopropyl triethoxy silane, 3-glycidoxypropyl trimethoxy silane, 3-glycidoxypropyl dimethyl methoxysilane, 2-(3,4-epoxycyclohexyl)ethyl trimethoxy silane, 3-chloropropyl methyl dimethoxy silane, 3-chloropropyl trimethoxy silane, 3-methacryloxypropyl trimethoxy silane, 3-mercaptopropyl trimethoxy silane or a commercially available product manufactured by Shin-Etsu Chemical Company (trade name of KBM403).

When using a silane-based compound as the adhesion auxiliary agent, based on the usage amount of 100 parts by weight of the polysiloxane (A), the content of the silane-based compound is 0 parts by weight to 2 parts by weight; preferably 0.05 parts by weight to 1 parts by weight; and more preferably 0.1 parts by weight to 0.8 parts by weight.

The surfactants may be, for example, anionic surfactants, cationic surfactants, nonionic surfactants, amphoteric surfactants, polysiloxane-based surfactants, fluorine-based surfactants, or a combination thereof.

Examples of the surfactant include (1) polyoxyethylene alkyl ethers: polyoxyethylene lauryl ether, etc.; (2) polyoxyethylene phenyl ethers: polyoxyethylene octyl phenyl ether, polyoxyethylene nonyl phenyl ether, etc.; (3) polyethylene glycol diesters: polyethylene glycol dilaurate, polyethylene glycol distearate, etc.; (4) sorbitan fatty acid esters; and (5) fatty acid modified poly esters; and (6) tertiary amine modified polyurethanes. Commercially available products of surfactant are, for example, KP (manufactured by Shin-Etsu Chemical), SF-8427 (manufactured by Dow Corning Toray Silicone Co., Ltd.), Polyflow (manufactured by Kyoeisha Grease Chemical), F-Top (manufactured by Tochem Products Co., Ltd.), Megaface (manufactured by Dainippon ink chemical industry (DIC)), Fluorade (by Sumitomo 3M Co., Ltd.), Surflon (manufactured by Asahi Glass), SINOPOL E8008 (Sino Japan Chemical Co. Ltd.), F-475 (manufactured by Dainippon ink chemical industry) or combinations thereof.

Based on the usage amount of 100 parts by weight of the polysiloxane (A), the content of the surfactant is 0.5 parts by weight to 50 parts by weight; preferably 1 parts by weight to 40 parts by weight; and more preferably 3 to 30 parts by weight.

Examples of defoamers include Surfynol MD-20, Surfynol MD-30, EnviroGem AD01, EnviroGem AE01, EnviroGem AE02, Surfynol DF110D, Surfynol 104E, Surfynol 420, Surfynol DF37, Surfynol DF58, Surfynol DF66, Surfynol DF70 and Surfynol DF210 (manufactured by Air products) and the like. Based on the usage amount of 100 parts by weight of the polysiloxane (A), the content of the defoamer is 1 parts by weight to 10 parts by weight; preferably 2 parts by weight to 9 parts by weight; and more preferably 3 parts by weight to 8 parts by weight.

Examples of solubility promoters include N-hydroxydicarboxylic imide and the compound containing the phenolic hydroxyl group. For example, solubility promoter is the compound containing the phenolic hydroxyl group used in o-naphthoquinonediazidesulfonate (B). Based on the usage amount of 100 parts by weight of the polysiloxane (A), the content of the solubility promoter is 1 parts by weight to 20 parts by weight; preferably 2 parts by weight to 15 parts by weight; and more preferably 3 parts by weight to 10 parts by weight.

<Method for Preparing Photosensitive Polysiloxane Composition>

The photosensitive polysiloxane composition is, for example, prepared by the method below: the polysiloxane (A), the o-naphthoquinonediazidesulfonate (B), the silane compound (C) containing an amic acid group and the solvent (D) are placed and stirred in a stirrer, so as to be uniformly mixed into a solution state; and if necessary, the nitrogen-containing heterocyclic compound (E), the additive (F) or a combination of the two may further be added to the above mixture.

<Method for Forming Protecting Film and an Element Having the Protecting Film>

The invention provides the photosensitive polysiloxane composition, which can be used to form a protecting film with favorable cross-section shape and heat resistance.

The invention provides an element having the protecting film, which includes the element and the protecting film, wherein the protecting film covers on the element. Specifically, the element having the protecting film is, for example, a display element, a semiconductor element, a core material of an optical waveguide, a covering material, or so forth. In addition, the photosensitive polysiloxane composition may also be used to form a planarization film for TFT substrate or an interlayer insulating film, etc.

The following descriptions detail the method for forming the protecting film, which comprises: using a photosensitive polysiloxane composition to form a pre-baked coating film; pattern exposuring of the pre-baked coating film; removing the unexposed region of the film by an alkali developer to form the pattern; and performing the post-baking treatment to form a protecting film.

—Forming a Pre-Baked Coating Film—

By spin coating, cast coating, or roll coater coating method, the photosensitive polysiloxane composition in the above solution state is coated onto the element to be protected (hereinafter referred to as substrate), to form a coating film.

The above-mentioned substrate may be alkali-free glass, soda lime glass, Pyrex glass, quartz glass, or glasses adhered with the transparent conductive film used in a liquid crystal display device, or the substrate (such as, silicon substrate) used in the photoelectric conversion apparatus (such as a solid-state imaging apparatus).

After the coating film is formed, most of the organic solvent of the photosensitive polysiloxane composition is removed by drying under reduced pressure. Next, the remaining solvent is completely removed by a pre-bake method to form a pre-baked coating film.

The conditions for drying under reduced pressure and pre-bake vary according to the type and ratio of each component. Generally, drying under reduced pressure is performed at a pressure less than 0 Torr to 200 Torr for 1 second to 60 seconds, and the pre-bake is a heat treatment performed on the coating film at a temperature of 70° C. to 110° C. for 1 minute to 15 minutes.

—Pattern Exposure—

Then, the pre-baked coating film is exposed with a photomask having a specific pattern. The light used in the exposure process is preferably an ultraviolet light such as a g-ray, an h-ray, or an i-ray. In addition, the ultraviolet light irradiation apparatus can be a(n) (ultra-)high pressure mercury vapor lamp or a metal halide lamp.

—Development—

Unnecessary portions of the above exposed pre-bake coating film are removed by immersing the pre-baked coating film in the developer a temperature between 23±2° C. and developing for about 15 seconds to 5 minutes, so as to form a semi-finished product of the protecting film with a predetermined pattern on the substrate. The developer may be alkaline compounds, such as, sodium hydroxide, potassium hydroxide, sodium carbonate, sodium hydrogen carbonate, potassium carbonate, potassium bicarbonate, sodium silicate, sodium methylsilicate, aqueous ammonia, ethylamine, diethylamine, dimethyl ethanolamine, tetramethylammonium hydroxide (THAM), tetraethylammonium hydroxide, choline, pyrrole, piperidine, or 1,8-diaza-bicyclo-(5.4.0)-7-undecene.

It is noted that if the concentration of the developer is too high, the specific pattern may be damaged or the resolution of the specific pattern may be deteriorated. If the concentration of the developer is too low, poor development may happen, the specific pattern may not be formed or residues of the composition remain in exposed portions. Therefore, the concentration of the developer will affect the formation of a specific pattern of the subsequent photosensitive polysiloxane composition after exposure. The concentration range of the liquid developer is preferably from 0.001 wt % to 10 wt %; more preferably from 0.005 wt % to 5 wt %; further more preferably from 0.01 wt % to 1 wt %. The present embodiment of the present invention employs a developer of 2.38 wt % tetramethylammonium hydroxide. It is noted that even using a lower concentration of the developer, the photosensitive polysiloxane composition of the invention is capable of forming a fine pattern.

—Post-Baking Processing—

The substrate (semi-finished product of the protecting film with the predetermined pattern on the substrate) is washed with water to remove the unnecessary portions of the above-mentioned exposed pre-baked coating film. Then, the compressed air or compressed nitrogen is used to dry up the semi-finished product of the protecting film with the predetermined pattern. Finally, the semi-finished product of the protecting film with the predetermined pattern is post-baked on a heating plate or oven. The heating temperature is set between 100° C. to 250, and the heating time with a hot plate is 1 to 60 minutes or the heating time with an oven is 5 to 90 minutes. Thereby, the semi-finished product of the protecting film with the predetermined pattern is cured to form a protecting film.

For instance, the protecting film is, for example, formed by the following steps. Firstly, an approximate of 2 μm coating film of photosensitive polysiloxane composition is formed on a untreated glass substrate (100×100×0.7 mm) by spin coating. After 2 minutes of pre-baking at 110° C., the pre-baked coating film is placed under an exposure machine. Next, a photomask for positive photoresist is disposed between the exposure machine and the pre-baked coating film, and the pre-baked coating film is irradiated by an ultraviolet light with a power of 100 mJ/cm$^2$ from the exposure machine. The exposed pre-baked coating film is immersed in a 2.38% TMAH solution at 23° C. for 60 seconds so as to remove the exposed parts. Next, after being cleaned with DI water, the developed coating film is then directly irradiated by the exposure machine at a power of 200 mJ/cm$^2$. Finally, by post-baking at 230° C. for 60 minutes, a glass substrate with a protecting film formed thereon may be obtained.

The invention will provide more details hereinafter in the following embodiments, but it should be understood that these examples are only illustrative and for illustrative purposes and should not be construed to limit the present invention.

SYNTHESIS EXAMPLES

The following descriptions detail synthesis example 1 to synthesis example 6 of a polysiloxane (A):

Synthesis Example 1

Following adding 0.30 mole of methyl trimethoxy silane (hereinafter referred to MTMS), 0.65 mole of phenyl trimethoxy silane (hereinafter referred to PTMS), 0.05 mole of 3-(triethoxysilyl) propyl succinic anhydride (hereinafter referred to GF-20) and 200 g of propylene glycol monoethyl ether (hereinafter referred to PGEE), into a 500 mL three-necked flask, an aqueous oxalic acid solution (0.40 g oxalic acid/75 g water) is added at room temperature with stirring within 30 minutes. Next, the flask is immersed in 30° C. oil bath and stirred for 30 minutes. Then, within 30 minutes, the temperature of the oil bath is raised to 120° C. After the solution temperature is dropped to 105° C., heating is resumed with stirring for polymerization for 6 hours. Then again, the solvent is removed using distillation to obtain the polysiloxane (A–1). The types and usage amounts of the raw materials of the polysiloxane (A–1) are shown in Table 1.

Synthesis Example 2 to Synthesis Example 6

The polysiloxane (A) of synthesis example 2 to synthesis example 6 are prepared by the same steps as the synthesis example 1, and differences is: composition, usage amount, reaction temperature and polycondensation time (as shown in Table 1) of the polysiloxane (A) are varied, wherein compounds corresponded to the labels in Table 1 are as shown below.

ABBREVIATION COMPOUNDS

MTMS Methyltrimethoxysilan
DMDMS Dimethyldimethoxysilane
PTMS Phenyltrimethoxysilane
PTES Phenyltriethoxysilane
GF-20 3-(triethoxysilyl)propylsuccinic anhydride
TMSG 3-(trimethoxysilyl)propylglutaric anhydride
TMSOX-D 2-oxetanylbutoxypropyltrimethoxysilane
TESOX-D 2-oxetanylbutoxypropyltriethoxysilane
DMS-S27 Silanol terminated polysiloxane, trade name: DMS-S27, manufactured by Gelest company.
PGEE Propylene glycol monoethyl ether
DAA Diacetone alcohol (viz., 4-hydroxy-4-methyl-2-pentanone)
 DI water
 Oxalic acid referred to PGEE) are added into a 500 ml three-necked flask and are reacted at 25° C. (viz., reaction temperature) for 2 hours (viz., reaction time). Next, a silane compound (C–1) containing an amic acid group may be obtained by removing solvent using reduced pressure distillation. The composition and the usage amount of the silane compound (C–1) containing an amic acid group are as shown in Table 2, wherein compounds corresponded to the labels in Table 2 are as shown below.

ABBREVIATION COMPOUNDS (c-1-1) p-aminophenyltrimethoxysilane
(c-1-2) 3-aminopropyltriethoxysilane
(c-1-3) N-(2-aminoethyl)-3-aminopropyltriethoxysilane
(c-2-1) 2-trimethoxysilyl ethylphthalic anhydride
(c-2-2) 3-(triethoxysilyl)propylsuccinic anhydride
(c-2-3) 3-(triethoxysilyl)propylglutaric anhydride
PGEE Propylene glycol monoethyl ether
DAA Diacetone alcohol (viz., 4-hydroxy-4-methyl-2-pentanone)

Synthesis Example 8 to Synthesis Example 13

Synthesis example 8 to synthesis example 13 of the silane compound (C) containing an amic acid group are prepared by the same steps as the synthesis example 7, and differences is: composition, usage amount, reaction temperature and reaction time (as shown in Table 2) of the silane compound (C) containing an amic acid group are varied.

Comparative Synthesis Example 1

The silane compound (C-8) containing an imide group of the comparative synthesis example 1 is prepared by the same

TABLE 1

| | | Synthesis Example | | | | | |
|---|---|---|---|---|---|---|---|
| | | 1 | 2 | 3 | 4 | 5 | 6 |
| Polysiloxane | | A-1 | A-2 | A-3 | A-4 | A-5 | A-6 |
| Silane monomer/ | MTMS | 0.30 | — | — | 0.65 | 0.50 | — |
| Polysiloxane (mol) | DMDMS | — | 0.40 | 0.60 | — | — | 0.40 |
| | PTMS | 0.65 | 0.40 | 0.35 | — | 0.42 | 0.50 |
| | PTES | — | 0.20 | — | 0.25 | — | — |
| | GF-20 | 0.05 | — | — | — | — | — |
| | TMSG | — | — | 0.05 | — | — | — |
| | TMSOX-D | — | — | — | 0.09 | — | 0.05 |
| | TESOX-D | — | — | — | — | 0.08 | 0.05 |
| | DMS-S27 | — | — | — | 0.01 | — | — |
| Solvent (g) | PGEE | 200 | 100 | 200 | 200 | 250 | 200 |
| | DAA | — | 100 | — | — | — | — |
| Catalyst (g) | DI water | 75 | 75 | 75 | 75 | 75 | 75 |
| | Oxalic acid | 0.40 | 0.40 | 0.35 | 0.45 | 0.40 | 0.40 |
| Reaction temperature (° C.) | | 105 | 110 | 105 | 110 | 105 | 105 |
| Polycondensation time (hour) | | 6 | 5 | 6 | 6 | 5 | 6 |

The following descriptions detail synthesis example 7 to synthesis example 13 of a silane compound (C) containing an amic acid group and its comparative synthesis example 1 to comparative synthesis example 3:

Synthesis Example 7

1.0 mole of p-aminophenyltrimethoxysilane (c-1-1), 1.0 mole of 2-trimethoxysilyl ethylphthalic anhydride (c-2-1) and 400 g of propylene glycol monoethyl ether (hereinafter steps as the synthesis example 7, and differences is: composition, usage amount, reaction temperature and reaction time (as shown in Table 2) thereof are varied, wherein compounds corresponded to the labels in Table 2 are as shown below. Herein, since the reaction temperature of the comparative synthesis example 1 is relatively higher, the intermediate product—the silane compound containing an amic acid group further formed into the silane compound containing an imide group via dehydration reaction.

TABLE 2

|  |  | Synthesis Example | | | | | | | Comparative Synthesis Example |
|---|---|---|---|---|---|---|---|---|---|
|  |  | 7 | 8 | 9 | 10 | 11 | 12 | 13 | 1 |
| Silane compound containing an amic acid group |  | C-1 | C-2 | C-3 | C-4 | C-5 | C-6 | C-7 | — |
| Silane compound containing imide group |  | — | — | — | — | — | — | — | C-8 |
| Silane compound containing an amino group (mole) | (c-1-1) | 1.0 | — | — | 0.5 | — | 1.0 | — | 1.0 |
|  | (c-1-2) | — | 1.0 | — | 0.5 | 0.5 | — | 0.2 | — |
|  | (c-1-3) | — | — | 1.1 | — | 0.5 | 0.5 | 1.0 | — |
| Compound containing an anhydride group (mole) | (c-2-1) | 1.0 | — | — | — | 1.0 | — | 0.3 | — |
|  | (c-2-2) | — | 0.9 | — | 1.0 | — | 0.5 | — | 1.0 |
|  | (c-2-3) | — | — | 1.0 | — | — | 0.3 | 0.7 | — |
| Solvent (g) | PGEE | 400 | — | 500 | — | 400 | 300 | — | — |
|  | DAA | — | 400 | — | 300 | — | 100 | 400 | 400 |
| Reaction temperature (° C.) |  | 25 | 30 | 30 | 30 | 45 | 60 | 50 | 220 |
| Reaction time (hour) |  | 2 | 3 | 3 | 4 | 2 | 1 | 1.5 | 5 |

Comparative Synthesis Example 2

32.84 g (160 mmol) of isocyanate propyltrimethoxysilane is added into 40 g of γ-butyrolactone (GBL), so as to be stirred and dissolved. Next, after adding 17.93 g (80 mmol) of hydrogenated pyromellitic dianhydride, the mixture is firstly stirred at room temperature and then stirred at 140° C. for 2 hours. Subsequently, an imide-based silane compound represented by formula (7) (namely, the silane compound (C-9) containing an imide group) may be obtained by removing solvent using reduced pressure distillation.

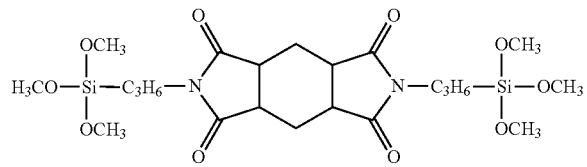

formula (7)

Comparative Synthesis Example 3

After 35.42 g (160 mmol) of aminopropyl triethoxysilane and 16.01 g (160 mmol) of succinic anhydride are added into 400 g of diacetone alcohol, the reaction solution is firstly stirred at the room temperature and then stirred at 60° C. for 2 hours. Next, the temperature of the reaction solution is raised up to 160° C. Subsequently, water and diacetone alcohol are both being boiled while being reacted for 6 hours. Finally, an imide-based silane compound represented by formula (8) (namely, the silane compound (C-10) containing an imide group) may be obtained by removing solvent using reduced pressure distillation.

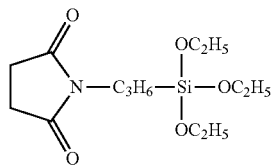

formula (8)

Comparative Synthesis Example 4

29.6 g (0.2 mol) of phthalic anhydride is added into 195 g of N-methyl-2-pyrrolidone so as to be stirred, thereby forming a mixed solution. The mixed solution is cooled to 0° C. and then 3-aminopropyltriethoxysilane solution (namely, a solution formed by dissolving 44.2 g (0.2 mol) of 3-aminopropyltriethoxysilane in 100 g of N-methyl-2-pyrrolidone) were added. Next, after raising the mixed solution back to the room temperature and stirring it for 4 hours, an amic acid group-based silane compound represented by formula (9) (namely, the silane compound (C-11) containing an amic acid group) may be obtained by removing solvent using reduced pressure distillation.

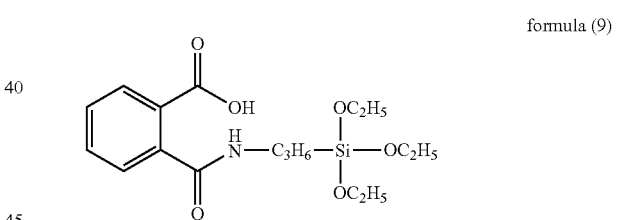

formula (9)

[Example of Photosensitive Polysiloxane Composition]

The following descriptions detail example 1 to example 8 and comparative example 1 to comparative example 7 of the photosensitive polysiloxane composition:

Example 1

1. Preparation of Photosensitive Polysiloxane Composition

Following adding 100 parts by weight of polysiloxane (A-1), 1 parts by weight of o-naphthoquinonediazidesulfonate formed by 1-[1-(4-hydroxyphenyl) isopropyl]-4-[1,1-bis(4-hydroxyphenyl)ethyl]benzene and o-naphthoquinone diazide 5-sulfonic acid (B-1) (trade name: DPAP200, manufactured by DKC, and with an average degree of esterification of 67%), 0.1 parts by weight of silane compound (C-1) containing an amic acid group and 0.1 parts by weight of SF-8427 (F-1) into 100 parts by weight of propylene glycol monomethyl ether acetate (PGMEA) (D-1), the preparation of the photosensitive polysiloxane composition of the example 1 may be completed after being stirred evenly by a shaking type stirrer.

2. Forming the Protecting Film

The photosensitive polysiloxane composition of the example 1 is coated onto the untreated glass substrate by spin coating to form a coating film. Next, the coating film is pre-baked at 100° C. for 120 seconds to form a pre-baked coating film with a thickness of about 2.5 μM. Then, the pre-baked coating film is pattern exposed using 140 mJ/cm² UV light from the exposure machine (model: AG500-4N, manufacture by M&R Nanotechnology); and a photomask being used is a line and space photomask (manufactured by NIPPON FILCON). Subsequently, the substrate carrying the exposed pre-baked coating film thereon is immersed in 2.38% TMAH aqueous solution at 23° C. to develop for 1 minute at 23° C., so as to remove the unexposed portion of the coating film on the glass substrate, Next, the glass substrate is washed with water, Then again, the exposed and developed pre-baked coating film is directly irradiated by the exposure machine with an exposure energy 200 mJ/cm². Finally, after baking the pre-baked coating film in the oven at 230° C. for 60 minutes, the protecting film of the example 1, which has a pattern formed on the glass substrate, can be obtained. Evaluation results for the protecting film formed by the above method are shown in Table 3.

Example 2 to Example 8

The photosensitive polysiloxane compositions and the protecting films of the example 2 to the example 8 are prepared by the same steps as the example 1, and differences is: composition and usage amount of the photosensitive polysiloxane composition (as shown in Table 3) are varied, wherein compounds corresponded to the labels in Table 3 are as shown below. Evaluation results for the protecting film formed by the above method are shown in Table 3.

ABBREVIATION COMPOUNDS

B-1 O-naphthoquinonediazidesulfonate formed by 1-[1-(4-hydroxyphenyl) isopropyl]-4-[1,1-bis(4-hydroxyphenyl) ethyl]benzene and o-naphthoquinone diazide 5-sulfonic acid B-2 O-naphthoquinonediazidesulfonate formed by 2,3,4-trihydroxybenzophenone and o-naphthoquinone diazide 5-sulfonic acid D-1 propylene glycol monomethyl ether acetate (PGMEA)

D-2 Diacetone alcohol (viz., 4-hydroxy-4-methyl-2-pentanone)

D-3 Cyclohexanone

E-1 8-hydroxyquinoline

E-2 1,10-phenanthroline

E-3 4-hydroxypteridin

F-1 SF-8427 (manufactured by Dow Corning Toray Polysiloxane Co., Ltd.; surfactant)

F-2 3-glycidoxypropyltrimethoxysilane (trade name: KBM403, manufactured by Shin-Etsu Chemical; adhesion additive)

TABLE 3

| Composition | | Example 1 | 2 | 3 | 4 | 5 | 6 | 7 | 8 |
|---|---|---|---|---|---|---|---|---|---|
| Polysiloxane (A) | A-1 | 100 | — | — | — | — | — | — | — |
| (parts by weight) | A-2 | — | 100 | — | — | — | — | 100 | 50 |
| | A-3 | — | — | 100 | — | — | — | — | — |
| | A-4 | — | — | — | 100 | — | — | — | — |
| | A-5 | — | — | — | — | 100 | — | — | 50 |
| | A-6 | — | — | — | — | — | 100 | — | — |
| O-naphthoquinone- | B-1 | 1 | — | 5 | 10 | 30 | 10 | 25 | 10 |
| diazidesulfonate | B-2 | — | 3 | — | — | — | 10 | — | 5 |
| (B) (parts by weight) | | | | | | | | | |
| Silane compound (C) | C-1 | 0.1 | — | — | — | — | — | — | — |
| containing an amic acid | C-2 | — | 0.5 | — | — | — | 4 | — | — |
| group (parts by weight) | C-3 | — | — | 1 | — | — | — | — | — |
| | C-4 | — | — | — | 1 | — | — | — | 5 |
| | C-5 | — | — | — | — | 5 | — | — | — |
| | C-6 | — | — | — | — | — | 4 | — | — |
| | C-7 | — | — | — | 1 | — | — | 10 | — |
| Silane compound | C-8 | — | — | — | — | — | — | — | — |
| containing imide | C-9 | — | — | — | — | — | — | — | — |
| group (parts by weight) | C-10 | — | — | — | — | — | — | — | — |
| Silane compound (C') | C-11 | | | | | | | | |
| containing an amic acid | | | | | | | | | |
| group (parts by weight) | | | | | | | | | |
| Solvent (D) | D-1 | 100 | 300 | 500 | 300 | — | 1000 | 500 | 500 |
| (parts by weight) | D-2 | — | — | — | 300 | — | — | 100 | — |
| | D-3 | — | — | — | — | 800 | 200 | — | — |
| Nitrogen-containing | E-1 | — | — | 0.05 | — | — | 1 | — | — |
| heterocyclic compound | E-2 | — | 0.1 | — | — | 2 | — | — | — |
| (E) (parts by weight) | E-3 | — | — | — | — | — | — | — | — |
| Additive (F) | F-1 | 0.1 | — | 0.1 | — | — | — | — | — |
| (parts by weight) | F-2 | — | — | 0.1 | — | — | — | — | 0.2 |
| Testing items | cross-section shape | ◎ | ○ | ◎ | ◎ | ◎ | ◎ | ○ | ◎ |
| | heat resistance | ○ | ◎ | ◎ | ○ | ◎ | ◎ | ○ | ○ |

Comparative Example 1 to Comparative Example 7

The photosensitive polysiloxane compositions and the protecting films of the comparative example 1 to the comparative example 7 are prepared by the same steps as the example 1, and differences is: composition and usage amount of the photosensitive polysiloxane composition (as shown in Table 4) are varied, wherein compounds corresponded to the labels in Table 4 are as shown below. Evaluation results for the protecting film formed by the above method are shown in Table 4.

After calculating the obtained film thickness $\alpha 1$ and film thickness $\alpha 2$ using formula (10), a residual film ratio can be obtained.

Residual film ratio (%)=($\alpha 2/\alpha 1$)×100     formula (10)

The heat resistance of the protecting film is evaluated according to the following criteria. Higher residual film ratio indicates better heat resistance of the protecting film.
  ⊚: Residual film ratio≥98%
  ○: 98%>Residual film ratio≥95%
  X: Residual film ratio<95%

TABLE 4

| Composition | | Comparative Example | | | | | | |
|---|---|---|---|---|---|---|---|---|
| | | 1 | 2 | 3 | 4 | 5 | 6 | 7 |
| Polysiloxane macro- | A-1 | 100 | — | — | — | — | — | 100 |
| molecule (A) | A-2 | — | 100 | — | — | 100 | — | — |
| (parts by weight) | A-3 | — | — | 100 | — | — | — | — |
| | A-4 | — | — | — | 100 | — | — | — |
| | A-5 | — | — | — | — | — | 100 | — |
| | A-6 | — | — | — | — | — | — | — |
| O-naphthoquinone- | B-1 | 3 | — | 5 | 10 | 10 | 10 | 5 |
| diazidesulfonate (B) (parts by weight) | B-2 | — | 5 | — | — | — | — | 5 |
| Silane compound (C) | C-1 | — | — | — | — | — | — | — |
| containing an amic acid | C-2 | — | — | — | — | — | — | — |
| group (parts by weight) | C-3 | — | — | — | — | — | — | — |
| | C-4 | — | — | — | — | — | — | — |
| | C-5 | — | — | — | — | — | — | — |
| | C-6 | — | — | — | — | — | — | — |
| | C-7 | — | — | — | — | — | — | — |
| Silane compound | C-8 | — | — | 5.0 | — | 5.0 | — | — |
| containing imide | C-9 | — | — | — | 5.0 | — | — | — |
| group (parts by weight) | C-10 | — | — | — | — | — | 5.0 | — |
| Silane compound (C') containing an amic acid group (parts by weight) | C-11 | — | — | — | — | — | — | 5.0 |
| Solvent (D) | D-1 | 300 | — | 500 | — | 800 | 500 | — |
| (parts by weight) | D-2 | — | 500 | — | — | — | — | 500 |
| | D-3 | — | — | — | 500 | — | — | — |
| Nitrogen-containing | E-1 | — | — | — | — | — | — | — |
| heterocyclic compound | E-2 | — | — | — | — | — | — | — |
| (E) (parts by weight) | E-3 | — | — | — | — | — | — | — |
| Additive (F) | F-1 | — | — | — | — | — | — | — |
| (parts by weight) | F-2 | — | — | — | — | — | — | — |
| Testing items | Cross-section shape | X | X | X | X | X | X | X |
| | Heat resistance | Δ | Δ | Δ | Δ | Δ | Δ | Δ |

Evaluation Methods
1. Cross-Section Shape

Figure 2:
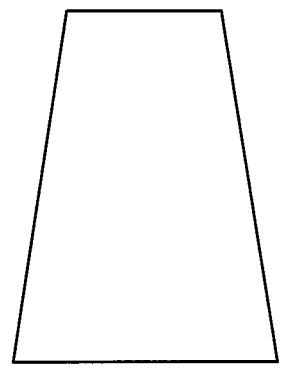
FIG. 2 is a schematic diagram showing a cross-section of forward tapered shape.
Figure 3:
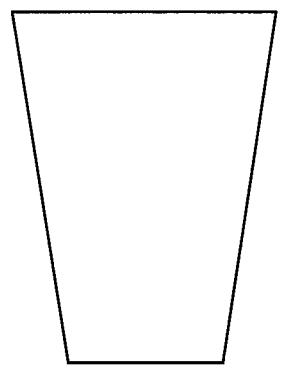
FIG. 3 is a schematic diagram showing a cross-section of reversed tapered shape.
Figure 4:
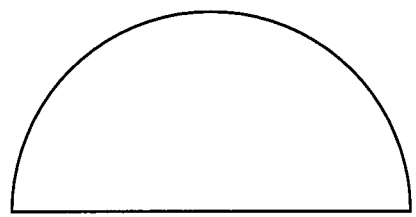
FIG. 4 is a schematic diagram showing a cross-section of oval shape.

A metal layer with a thickness of 5000 Å is deposited on the protecting film via a vacuum deposition machine (model: EVD-500, manufactured by Canon ANELVA corp.), and then the cross-section shape of the protecting film on the glass substrate is observed by a scanning electron microscope (SEM). The cross-section shape of the protecting film is evaluated according to the following criteria.
  A Vertical shape (please refer to FIG. 1): ⊚
  B Forward tapered shape (please refer to FIG. 2): ○
  C Reversed tapered shape (please refer to FIG. 3): X
  D Oval shape (please refer to FIG. 4): X 2. Heat Resistance A film thickness $\alpha 1$ of the protecting film is measured by a Alpha-step IQ Surface Profiler (manufactured by KLA-Tencor Corporation). Next, after baking the protecting film at 230° C. for 180 minutes, a film thickness $\alpha 2$ of the protecting film is also measured again by Alpha-step IQ Surface Profiler.

<Evaluation Results>

It can be known from Table 3 and Table 4, the protecting film (example 1 to example 8) formed by the photosensitive polysiloxane composition containing the silane compound (C) containing an amic acid group as compared to the protecting film (comparative example 1 to comparative example 2) formed by the photosensitive polysiloxane composition without the silane compound (C) containing an amic acid group, the cross-section shape and the heat resistance of the protecting film formed by the photosensitive polysiloxane composition containing the silane compound (C) containing an amic acid group are both more favorable.

On the other hand, the protecting film (example 1 to example 8) formed by the photosensitive polysiloxane composition containing the silane compound (C) containing an amic acid group as compared to the protecting film (comparative example 3 to comparative example 6) formed by the photosensitive polysiloxane composition containing the silane compound imide group (e.g., the silane compound containing an imide group (C-8), the silane compound containing an imide group (C-9) and the silane compound containing an imide group (C-10)), the cross-section shape and the heat resistance of the protecting film formed by the photosensitive polysiloxane composition containing the silane compound (C) containing an amic acid group are both more favorable.

In addition, the protecting film (example 1 to example 8) formed by the photosensitive polysiloxane composition containing the silane compound (C) containing an amic acid group as compared to the protecting film (comparative example 7) formed by the photosensitive polysiloxane composition containing the silane compound containing an amic acid group (C-11), the cross-section shape and the heat resistance of the protecting film formed by the photosensitive polysiloxane composition containing the silane compound (C) containing an amic acid group are both more favorable. It is to be noted that, the silane compound (C) containing an amic acid group used in example 1 to example 8 has two silicon-containing groups (—SiR$_3$, R is defined to be same as R$^3$ and R$^{3'}$ in formula (2)), and the silane compound containing an amic acid group (C-11) used in comparative example 7 has only one silicon containing—group, and thus the silane compound (C) containing an amic acid group used in example 1 to example 8 has better degree of crosslinking with other compositions in the photosensitive polysiloxane composition, so that the cross-section shape and the heat resistance of the protecting film in example 1 to example 8 are both favorable.

Moreover, the protecting film (example 2 to 3 and 5 to 6) formed by the photosensitive polysiloxane composition containing the nitrogen-containing heterocyclic compound (E), as compared to the protecting film (example 1, 4 and 7 to 8) formed by the photosensitive polysiloxane composition without the nitrogen-containing heterocyclic compound (E), has more favorable heat resistance.

In summary, the photosensitive polysiloxane composition of the invention, due to containing the silane compound containing an amic acid group, when being used to form the protecting film, may enable the protecting film to show favorable cross-section shape and heat resistance. Moreover, when the photosensitive polysiloxane composition includes the nitrogen-containing heterocyclic compound, the heat resistance of the protecting film is more favorable.

While the invention has been described and illustrated with reference to specific embodiments thereof, these descriptions and illustrations do not limit the invention. It should be understood by those skilled in the art that various changes may be made and equivalents may be substituted without departing from the true spirit and scope of the invention as defined by the appended claims. In view of the foregoing, it is intended that the present invention cover modifications and variations of this invention provided they fall within the scope of the following claims and their equivalents.

What is claimed is:

1. A photosensitive polysiloxane composition, comprising:
a polysiloxane (A);
an o-naphthoquinonediazidesulfonate (B);
a silane compound (C) containing an amic acid group; and
a solvent (D),
wherein the polysiloxane (A) is formed by polycondensing a compound represented by formula (1), $$Si(R^1)_w(OR^2)_{4-w} \quad \text{formula (1),}$$

in formula (1), R$^1$ each independently represents a hydrogen atom, an alkyl group of 1-10 carbon atoms, an alkenyl group of 2-10 carbon atoms, an aryl group of 6-15 carbon atoms, an alkyl group containing an anhydride group, an alkyl group containing an epoxy group, or an alkoxy group containing an epoxy group; R$^2$ each independently represents a hydrogen atom, an alkyl group of 1-6 carbon atoms, an acyl group of 1-6 carbon atoms, or an aryl group of 6-15 carbon atoms; w represents an integer selected from 0, 1, 2, and 3, wherein a least one of R$^1$ represents an alkyl group containing anhydride group, an alkyl group containing an epoxy group, or an alkoxy group containing an epoxy group; and wherein the silane compound (C) containing an amic acid group is represented by formula (2),

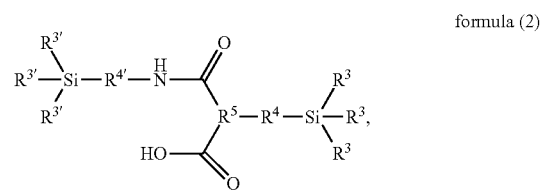

formula (2)

in formula (2), R$^3$ and R$^{3'}$ each independently represents an alkyl group of 1-6 carbon atoms, a substituted alkyl group of 1-6 carbon atoms, an alkoxy group of 1-6 carbon atoms, a substituted alkoxy group of 1-6 carbon atoms, a phenyl group, a substituted phenyl group, a phenoxy group, or a substituted phenoxy group; R$^4$ and R$^{4'}$ each independently represents a divalent organic group of 1-10 carbon atoms; R$^5$ represents an organic group of 2-20 carbon atoms.

2. The photosensitive polysiloxane composition as recited in claim 1, wherein, based on an usage amount of 100 parts by weight of the polysiloxane (A), an usage amount of the o-naphthoquinonediazidesulfonate (B) is 1 parts by weight to 30 parts by weight, an usage amount of the silane compound (C) containing an amic acid group is 0.1 parts by weight to 10 parts by weight, and an usage amount of the solvent (D) is 100 parts by weight to 1200 parts by weight.

3. The photosensitive polysiloxane composition as recited in claim 1 further comprising a nitrogen-containing heterocyclic compound (E), the nitrogen-containing heterocyclic compound (E) is selected from the group consisting of compounds represented by formula (3), formula (4), formula (5), and formula (6),

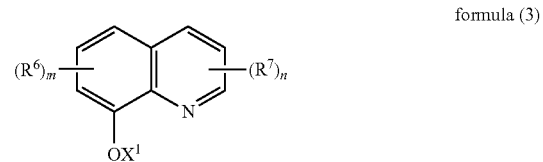

formula (3)

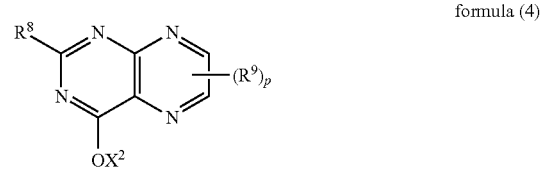

formula (4)

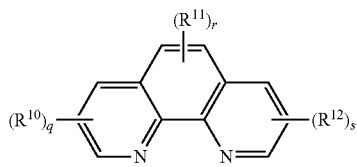

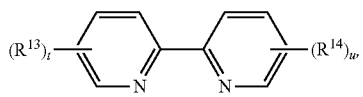

in formula (3), formula (4), formula (5), and formula (6), $X^1$ and $X^2$ each independently represents a hydrogen atom, an acyl group, or an alkyl group; $R^6$ to $R^{14}$ each independently represents a hydrogen atom, a hydroxyl group, a carboxylic acid group, a sulfonic acid group, an alkyl group, an amino group, a halogen atom, or a mercapto group; m, n, q, and s each independently represents an integer selected from 0, 1, 2, and 3; p and r each independently represents an integer selected from 0, 1, and 2; t and u each independently represents an integer selected from 0, 1, 2, 3, and 4.

4. The photosensitive polysiloxane composition as recited in claim 3, wherein, based on an usage amount of 100 parts by weight of the polysiloxane (A), an usage amount of the nitrogen-containing heterocyclic compound (E) is 0.05 parts by weight to 2 parts by weight.

5. A protecting film, comprising the photosensitive polysiloxane composition as recited in claim 1.

6. An element having a protecting film, comprising the element and the protecting film as recited in claim 5, wherein the protecting film covers the element, and the element comprises a display element, a semiconductor element, a core material of an optical waveguide, or a covering material.

7. A photosensitive polysiloxane composition, comprising:
a polysiloxane (A);
an o-naphthoquinonediazidesulfonate (B);
a silane compound (C) containing an amic acid group;
a solvent (D); and
a nitrogen-containing heterocyclic compound (E),
wherein the polysiloxane (A) is formed by polycondensing a compound represented by formula (1), $$Si(R^1)_w(OR^2)_{4-w} \quad \text{formula (1)},$$

in formula (1), $R^1$ each independently represents a hydrogen atom, an alkyl group of 1-10 carbon atoms, an alkenyl group of 2-10 carbon atoms, an aryl group of 6-15 carbon atoms, an alkyl group containing an anhydride group, an alkyl group containing an epoxy group, or an alkoxy group containing an epoxy group; $R^2$ each independently represents a hydrogen atom, an alkyl group of 1-6 carbon atoms, an acyl group of 1-6 carbon atoms, or an aryl group of 6-15 carbon atoms; w represents an integer selected from 0, 1, 2, and 3, and wherein the silane compound (C) containing an amic acid group is represented by formula (2),

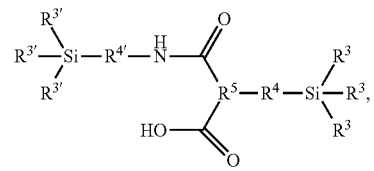

in formula (2), $R^3$ and $R^{3\prime}$ each independently represents an alkyl group of 1-6 carbon atoms, a substituted alkyl group of 1-6 carbon atoms, an alkoxy group of 1-6 carbon atoms, a substituted alkoxy group of 1-6 carbon atoms, a phenyl group, a substituted phenyl group, a phenoxy group, or a substituted phenoxy group; $R^4$ and $R^{4\prime}$ each independently represents a divalent organic group of 1-10 carbon atoms; $R^5$ represents an organic group of 2-20 carbon atoms, and wherein the nitrogen-containing heterocyclic compound (E) is selected from the group consisting of compounds represented by formula (3), formula (4), formula (5), and formula (6),

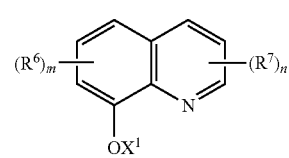

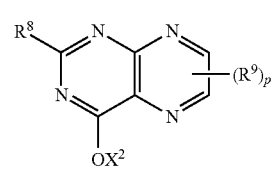

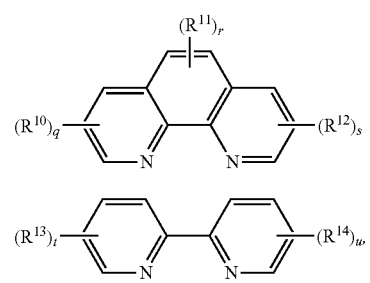

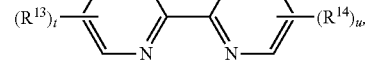

in formula (3), formula (4), formula (5), and formula (6), $X^1$ and $X^2$ each independently represents a hydrogen atom, an acyl group, or an alkyl group; $R^6$ to $R^{14}$ each independently represents a hydrogen atom, a hydroxyl group, a carboxylic acid group, a sulfonic acid group, an alkyl group, an amino group, a halogen atom, or a mercapto group; n, q, and s each independently represents an integer selected from 0, 1, 2, and 3; p and r each independently represents an integer selected from 0, 1, and 2; t and u each independently represents an integer selected from 0, 1, 2, 3, and 4.

8. The photosensitive polysiloxane composition as recited in claim 1, wherein, based on an usage amount of 100 parts by weight of the polysiloxane (A), an usage amount of the o-naphthoquinonediazidesulfonate (B) is 1 parts by weight to 30 parts by weight, an usage amount of the silane compound (C) containing an amic acid group is 0.1 parts by weight to 10 parts by weight, an usage amount of the solvent (D) is 100 parts by weight to 1200 parts by weight, and an usage amount of the nitrogen-containing heterocyclic compound (E) is 0.05 parts by weight to 2 parts by weight.

9. A protecting film, comprising the photosensitive polysiloxane composition as recited in claim 7.

10. An element having a protecting film, comprising the element and the protecting film as recited in claim 9, wherein the protecting film covers the element, and the element comprises a display element, a semiconductor element, a core material of an optical waveguide, or a covering material.

* * * * *